(12) United States Patent
Ruoff et al.

(10) Patent No.: US 10,606,048 B2
(45) Date of Patent: Mar. 31, 2020

(54) IMAGING OPTICAL UNIT FOR A METROLOGY SYSTEM FOR EXAMINING A LITHOGRAPHY MASK

(71) Applicant: Carl Zeiss SMT GmbH, Oberkochen (DE)

(72) Inventors: Johannes Ruoff, Aalen (DE); Ralf Müller, Aalen (DE); Susanne Beder, Aalen (DE); Ulrich Matejka, Jena (DE); Hans-Jürgen Mann, Oberkochen (DE); Jens Timo Neumann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 208 days.

(21) Appl. No.: 15/410,904

(22) Filed: Jan. 20, 2017

(65) Prior Publication Data

US 2017/0131528 A1     May 11, 2017

Related U.S. Application Data

(63) Continuation of application No. PCT/EP2015/066604, filed on Jul. 21, 2015.

(30) Foreign Application Priority Data

Jul. 22, 2014  (DE) .......... 10 2014 214 257
Aug. 28, 2014 (DE) .......... 10 2014 217 229

(51) Int. Cl.
*G02B 17/06* (2006.01)
*G02B 17/08* (2006.01)
(Continued)

(52) U.S. Cl.
CPC ........ *G02B 17/0647* (2013.01); *G02B 13/08* (2013.01); *G02B 17/0848* (2013.01);
(Continued)

(58) Field of Classification Search
CPC .......... G02B 17/0647; G02B 17/0652; G02B 17/0657; G02B 17/0663; G02B 17/06;
(Continued)

(56) References Cited

U.S. PATENT DOCUMENTS 7,379,175 B1   5/2008  Stokowski et al.
7,703,069 B1   4/2010  Liu et al.
(Continued)

FOREIGN PATENT DOCUMENTS

DE   102 20 815   11/2003  ............ G12K 7/00
DE   102 20 816   11/2003  ............ G21K 7/00
(Continued)

OTHER PUBLICATIONS

South Korean Office Action for South Korean Application No. 10-2017-7004990 dated Dec. 13, 2017.
(Continued)

*Primary Examiner* — Darryl J Collins
*Assistant Examiner* — Journey F Sumlar
(74) *Attorney, Agent, or Firm* — Fish & Richardson P.C.

(57) ABSTRACT

An imaging optical unit serves within a metrology system for examining a lithography mask. The lithography mask can be arranged in an object field of the imaging optical unit. The object field is defined by two mutually perpendicular object field coordinates. The imaging optical unit has an aperture stop of which the aspect ratio in the direction of the two object field coordinates differs from 1. This results in an imaging optical unit which can be used for the examination of lithography masks that are designed for projection exposure with an anamorphic projection optical unit.

21 Claims, 18 Drawing Sheets

(51) Int. Cl.
*G02B 13/08* (2006.01)
*G02B 21/04* (2006.01)
*G02B 21/36* (2006.01)
*G02B 27/09* (2006.01)

(52) U.S. Cl.
CPC ........... *G02B 21/04* (2013.01); *G02B 21/361* (2013.01); *G02B 27/0988* (2013.01)

(58) Field of Classification Search
CPC .. G02B 27/0988; G02B 21/361; G02B 21/04; G02B 13/08; G02B 17/0848
See application file for complete search history.

(56) References Cited

U.S. PATENT DOCUMENTS

| | | | |
|---|---|---|---|
| 8,352,885 | B2 | 1/2013 | Liu et al. |
| 2007/0032896 | A1 | 2/2007 | Ye et al. |
| 2007/0058269 | A1* | 3/2007 | Mann ................ G02B 17/0663 359/726 |
| 2008/0036986 | A1 | 2/2008 | Yamaguchi |
| 2009/0217233 | A1 | 8/2009 | Mimotogi et al. |
| 2010/0112465 | A1 | 5/2010 | Feldmann et al. |
| 2012/0287413 | A1* | 11/2012 | Komatsuda ........ G02B 17/0657 355/67 |
| 2013/0019212 | A1 | 1/2013 | Seidel et al. |
| 2013/0063716 | A1 | 3/2013 | Mann et al. |
| 2013/0083321 | A1* | 4/2013 | Wack ........................ G03F 1/84 356/239.3 |
| 2015/0234289 | A1 | 8/2015 | Ruoff |
| 2016/0259248 | A1 | 9/2016 | Maim |
| 2017/0102539 | A1* | 4/2017 | Brehm ................ G03F 7/70825 |
| 2017/0132782 | A1 | 5/2017 | Matejka et al. |

FOREIGN PATENT DOCUMENTS

| | | | | |
|---|---|---|---|---|
| DE | 10 2007 009 661 | | 3/2008 | ............ G02B 27/50 |
| DE | 10 2008 019 341 | | 10/2009 | ............ G01M 11/00 |
| DE | 10 2010 040 811 | | 3/2012 | ............ G02B 17/06 |
| EP | 2 506 061 | | 10/2012 | ............ G02B 17/08 |
| JP | 2011-108974 | | 6/2011 | ............ H01L 21/027 |
| KR | 2013-0019384 | | 2/2013 | ............ G03F 7/20 |
| WO | WO 2008/025433 | | 3/2008 | |
| WO | WO 2011/120821 | | 10/2011 | ............ G03F 7/20 |

OTHER PUBLICATIONS

German Examination Report for German Application No. DE 10 2014 214 257.1 dated Mar. 27, 2015.
International Search Report for International Application No. PCT/EP2015/066605 dated Nov. 5, 2015.
Dudley et al., "All-digital wavefront sensing for structured light beams", *Optics Express*, vol. 22, No. 11, pp. 14031-14040 (Jun. 2, 2014).
Fienup, "Phase retrieval algorithms: a comparison". Applied Optics vol. 21, No. 15, pp. 2758-2769 (Aug. 1982).
Hellweg et al., "AIMS™ EUV—the actinic aerial image review platform for EUV masks", *Proc. of SPIE*, vol. 7969, pp. 79690H-1-79690H-10 (2011).
Perlitz et al., "Concept and Feasibility of Aerial imaging Measurements on EUV Masks", *Proc. of SPIE*, vol. 7985, pp. 79850U-1-79850U-7 (2011).
Shanker et al., "Critical assessment of the transport of intensity equation as a phase recovery technique in optical lithography", *Proc. SPIE 9052, Optical Microlithography XXVII*, Mar. 31, 2014).
Van den Broek et al., "General framework for quantitative three-dimensional reconstruction from arbitrary detection geometries in TEM", *Physical Review B.*, vol. 87, No. 18 (May 2013).
Wang et al., "Spatial light interference microscopy (SLIM)", *Optics Express*, vol. 19, No. 2 (Jan. 17, 2011).
Wen et al., "Subnanoradian X-ray phase-contrast imaging using a far-field interferometer of nanometric phase gratings", *Nature Communications*, vol. 4 (Nov. 2013).
Zheng et al., "Wide-field, high-resolution Fourier ptychographic microscopy", *Nature Photonics*, vol. 7, No. 9, pp. 739-745 (Jul. 2013).
Zernike Polynomials, *Code V 10.4 Reference Manual*, pp. C-1-C16 (Sep. 2011).

* cited by examiner

IMAGING OPTICAL UNIT FOR A METROLOGY SYSTEM FOR EXAMINING A LITHOGRAPHY MASK

CROSS REFERENCE TO RELATED APPLICATIONS

This application is a continuation of International Application PCT/EP2015/066604, having a filing date of Jul. 21, 2015, which claims priority to German patent application 10 2014 214 257.1, filed on Jul. 22, 2014, and German patent application 10 2014 217 229.2, filed on Aug. 28, 2014. The entire contents of the above applications are hereby incorporated by reference.

TECHNICAL FIELD

The invention relates to an imaging optical unit for a metrology system for examining a lithography mask. The invention also relates to a metrology system with such an imaging optical unit.

BACKGROUND

Metrology systems of the type mentioned at the beginning are known from US 2013/0063716 A1, DE 102 20 815 A1, DE 102 20 816 A1 and US 2013/0083321 A1. EP 2 506 061 A1 discloses a projection optical unit for a projection exposure apparatus for producing semiconductor devices that uses an aperture stop in which the diameter of the stop in two mutually perpendicular directions differs by more than 10%. DE 10 2010 040 811 A1 describes an anamorphic projection optical unit. US 2008/0036986 A1 describes a projection exposure apparatus.

SUMMARY

In a general aspect, the present invention provides an imaging optical unit of the type mentioned at the beginning that can be used for the examination of lithography masks that are designed for projection exposure with an anamorphic projection optical unit.

In another general aspect, the invention is directed to an imaging optical unit for a metrology system (e.g., 2) for examining a lithography mask (e.g., 5), in which the lithography mask (e.g., 5) can be arranged in an object field (e.g., 3) of the imaging optical unit (e.g., 13, 40, 45, 46, 47), the object field (e.g., 3) being defined by two mutually perpendicular object field coordinates (e.g., x, y), wherein an aperture stop (e.g., 15, 42) of which the aspect ratio in the direction of the two object field coordinates (e.g., x, y) differs from 1.

Implementations can include one or more of the following features. The imaging optical unit is a magnifying projection optical unit similar to a microscope. An imaging scale can be at least 100 and may be for example 350 or else 850. The aperture stop may be arranged in a pupil plane of the imaging optical unit. The imaging optical unit is suitable for examining lithography masks that are designed for projection exposure with anamorphic projection optical units, that is to say have different typical structure sizes along different coordinates. Alternatively or additionally, the imaging optical unit may also be used for examining substrates that are used for a subsequent exposure or structuring in conjunction with a projection exposure for producing integrated semiconductor devices. Such substrates are also referred to as blanks.

An isomorphic form of imaging optical unit having an isomorphic configuration in which an imaging scale (e.g., $\beta_x$) in the direction of one of the two object field coordinates (e.g., x) does not differ from an imaging scale (e.g., $\beta_y$) in the direction of the other (e.g., y) of the two object field coordinates (e.g., x, y) can be produced comparatively easily.

In another general aspect, an imaging optical unit for a metrology system (e.g., 2) for examining a lithography mask is provided, wherein the lithography mask (e.g., 5) can be arranged in an object field (e.g., 3) of the imaging optical unit (e.g., 47), the object field (e.g., 3) being defined by two mutually perpendicular object field coordinates (e.g., x, y), and wherein an anamorphic configuration in which an imaging scale (e.g., $\beta_x$) in the direction of one (e.g., x) of the two object field coordinates (e.g., x, y) differs from an imaging scale (e.g., $\beta_y$) in the direction of the other (e.g., y) of the two object field coordinates (e.g., x, y).

Implementations can include one or more of the following features. An imaging scale in the direction of one of the two object field coordinates can be at least 200 and may lie in the range between 200 and 800 and may be for example 350. An imaging scale in the direction of the other of the two object field coordinates may lie in the range between 100 and 400 and may be for example 175. A ratio of the imaging scales of the imaging optical unit for the metrology system in the direction of the two object field coordinates may be exactly the inverse of the corresponding imaging scale ratio of a projection optical unit of a projection exposure apparatus with which such lithography masks are used in the production of semiconductor devices.

The imaging optical unit can include at least one mirror (e.g., M1 to M3) that has a reflection surface for imaging light (e.g., 1) that is formed as a free-form surface. The at least one free-form surface mirror has been found to be particularly suitable for maintaining demanding boundary conditions with respect for example to the installation space requirements or the imaging properties. The mirrors of such a configuration may have different basic curvatures, that is to say may have basic curvature values of which the absolute values differ by at least a factor of 1.1, by at least a factor of 1.2, by at least a factor of 1.5, by at least a factor of 2, by at least a factor of 3, by at least a factor of 5, by at least a factor of 10 or by a still greater factor. At least one of the free-form surface mirrors may have basic curvatures with different signs, that is to say have the basic form of a saddle surface.

The object field of the imaging optical unit can have a typical dimension of at least 200 µm. Such an object field dimension has been found to be particularly suitable for use for an imaging optical unit of a metrology system. Typical structure defects of the lithography mask can be reliably detected. The object field may be rectangular and have dimensions for example of 200 µm×200 µm or of 200 µm×400 The object field size may be chosen according to the magnification factor of the imaging optical unit. This allows a size adaptation to a light-sensitive area of a detector arranged in an image field of the imaging optical unit to be performed. Dimensions of the object field with a typical size of 200 µm may be used for example in the case of an imaging optical unit with a magnifying imaging scale of for example 350. A magnifying imaging scale in the range of 850 leads to a typical object field dimension that is less than 100 µm.

The imaging optical unit can have an elliptical aperture stop. Such an elliptical aperture stop has been found to be particularly suitable for achieving metrology imaging. An x/y semiaxis ratio of the elliptical aperture stop may differ by at least 10%. The x/y semiaxis ratio may be 2. A ratio of the stop diameter in the direction of the two semiaxes may lie in the range between 10:1 and 1.1:1. As an alternative to an elliptical form of aperture stop, the aperture stop may also be designed as oval or rectangular.

The aperture stop of the imaging optical unit can be arranged on a mirror of the imaging optical unit. Such an arrangement of the aperture stop leads to a particularly simple configuration of the imaging optical unit.

An anamorphic configuration of the imaging optical unit may also have an aperture stop.

The aperture stop may be arranged on the first mirror in the imaging-light beam path of the imaging optical unit between the object field and the image field.

In the imaging optical unit, the aperture stop (e.g., 42) can be arranged on a mirror of the imaging optical unit. Such an arrangement of the aperture stop has been found to be particularly suitable.

The imaging optical unit (e.g., 40, 45, 46, 47) can have precisely three mirrors (e.g., M1, M2, M3) in a beam path of imaging light (e.g., 1) between the object field (e.g., 3) and the image field. A configuration of the imaging optical unit according to claim 9 has been found to be particularly suitable. A sequence of basic curvatures of the mirrors in the beam path between the object field and the image field may be concave-concave-convex.

The imaging optical unit can have a wavefront error (rms) that is less than 100 m$\lambda$. Such a wavefront error leads to an imaging accuracy that is sufficient for metrology. The wavefront error can be 55 m$\lambda$, and may also be less than 40 m$\lambda$.

The imaging optical unit can have a chief-ray angle (CRA) of a central object field point that is at most 8°. Such a chief-ray angle leads to a good separation between an illumination light beam incident on a reflective photography mask and a reflected imaging light beam. The chief-ray angle can also be less than 8° and may be for example 5°.

The imaging optical unit can have at least four mirrors (e.g., M1 to M5), which are arranged in an imaging-light path between the object field (e.g., 3) and an image field (e.g., 14b). The configuration of the imaging optical unit with the at least four mirrors increases a design flexibility of the imaging optical unit. The imaging optical unit may have at least one intermediate image, for example precisely two intermediate images.

The at least four mirrors of the imaging optical unit can have at least two mirror groups (e.g., 49, 50), one (e.g., 49) of the mirror groups being of an anamorphic configuration and the other (e.g., 50) of the mirror groups being of an isomorphic configuration. The at least two mirror groups may be used for distributing the optical effects, to be specific for distributing an anamorphic effect on the one hand and a magnifying effect on the other hand, between the two mirror groups. The anamorphic imaging effect of such an imaging optical unit may be produced with the aid of the mirror group having a corresponding anamorphic imaging effect. A further mirror group of the imaging optical unit may then have an isomorphic imaging effect. Such an anamorphic mirror group may have an absolute imaging scale that deviates a little from 1, which for example lies in the region of 1 in the direction of one of the two object field coordinates and lies in the region of 2 in the direction of the other of the two object field coordinates.

The imaging optical unit may have precisely one mirror group which is displaceable as a whole in relation to another mirror group of the imaging optical unit. This displaceability may be used in particular in a metrology system for mounting a focus stack, that is to say a layer-by-layer image recording. Such a displacement between mirror groups may be performed with the aid of a motorized displacement drive. A displacement of a relative displacement between two mirror groups of the imaging optical unit may lie in the range of several µm or else in the range of several 10s of µm.

In another general aspect, a metrology system (e.g., 2) for examining a lithography mask comprises an illumination optical unit (e.g., 7) for illuminating the lithography mask (e.g., 5) to be examined; comprises an imaging optical unit in which the lithography mask (e.g., 5) can be arranged in an object field (e.g., 3) of the imaging optical unit (e.g., 13, 40, 45, 46, 47), the object field (e.g., 3) being defined by two mutually perpendicular object field coordinates (e.g., x, y), wherein an aperture stop (e.g., 15, 42) of which the aspect ratio in the direction of the two object field coordinates (e.g., x, y) differs from 1; and comprises a spatially resolving detection device (e.g., 14), arranged in an image field (e.g., 14b) of the imaging optical unit. The advantages of such a metrology system correspond to those that have already been explained above with reference to the imaging optical unit according to the invention.

A metrology system can be configured for examining a reflecting lithography mask (e.g., 5) in which the aperture stop (e.g., 15, 42) has a greater stop diameter (e.g., $B_x$) that is perpendicular to the plane of incidence (e.g., yz) of illumination light (e.g., 1) on the lithography mask (e.g., 5). The aperture stop arrangement allows a separation between an incident illumination light beam and an emerging imaging light beam in the region of the reflective lithography mask even in the case of large numerical apertures.

The imaging aperture stop may have an xy aspect ratio deviating significantly from 1.

The imaging optical unit may have an uneven number of mirrors, for example three mirrors or five mirrors.

The imaging optical unit may be optimized for use with EUV imaging light. For this, the optical components of the imaging optical unit may have correspondingly configured coatings, in particular highly reflective multi-layer coatings. The imaging light may have a wavelength in the range between 5 nm and 30 nm.

BRIEF DESCRIPTION OF DRAWINGS

An exemplary embodiment of the invention is explained in greater detail below with reference to the drawings. In said drawings.

DETAILED DESCRIPTION

Figure 1:
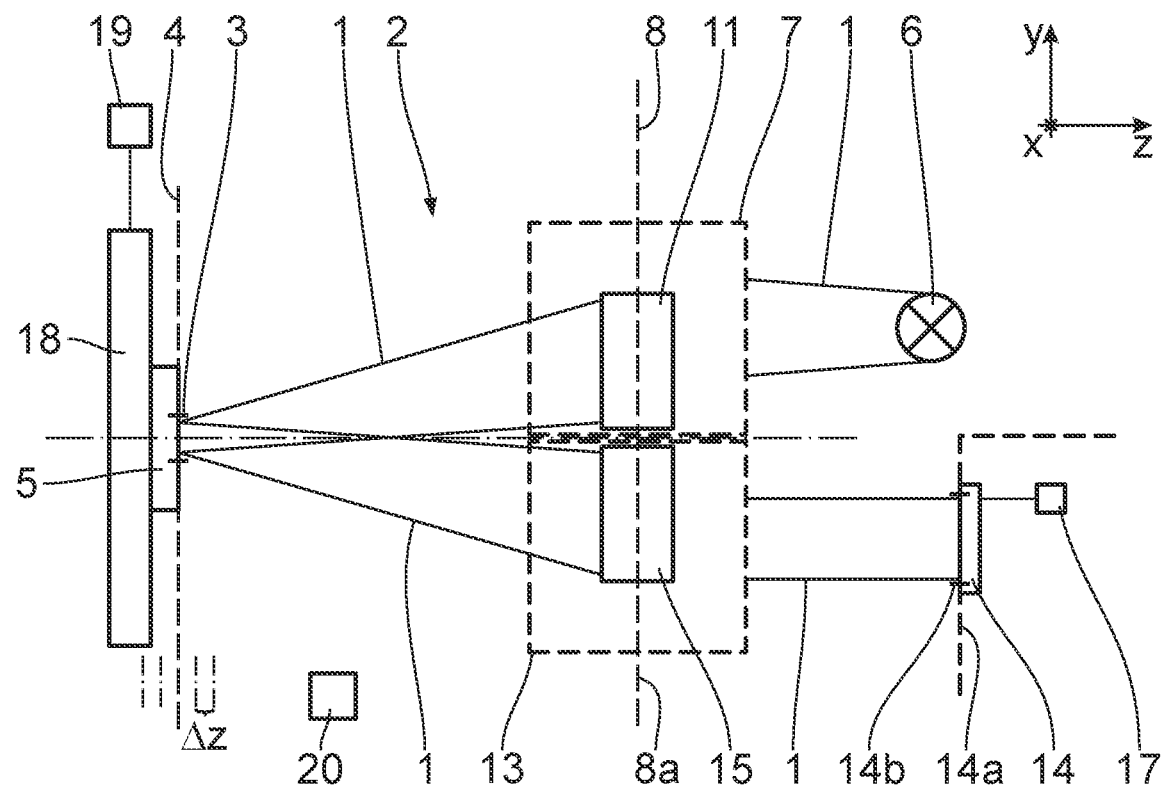
FIG. 1 shows highly schematically, in a plan view looking in a direction perpendicular to a plane of incidence, a metrology system for the examination of an object in the form of a lithography mask with EUV illumination and imaging light by use of an illumination optical unit and an imaging optical unit, each of which is represented extremely schematically.

A Cartesian xyz-coordinate system is used below to facilitate the illustration of positional relationships. In FIG. 1, the x axis runs perpendicularly to the plane of the drawing into the latter. In FIG. 1, the y axis runs upwards. In FIG. 1, the z axis runs towards the right.

FIG. 1 shows in a view corresponding to a meridional section a beam path of EUV illumination light and imaging light 1 in a metrology system 2 for the examination of an object 5, arranged in an object field 3 in an object plane 4, in the form of a reticle or a lithography mask with the EUV illumination light 1. The metrology system 2 is used for analyzing a three-dimensional (3D) aerial image (Aerial Image Metrology System) and serves for simulating and analyzing the effects of properties of lithography masks, known as reticles, which in turn are used during projection exposure for producing semiconductor devices, on the optical imaging by projection optical units within a projection exposure apparatus. Such systems are known from US 2013/0063716 A1 (cf. FIG. 3 therein), from DE 102 20 815 A1 (cf. FIG. 9 therein) and from DE 102 20 816 A1 (cf. FIG. 2 therein) and from US 2013/0083321 A1.

A further metrology application, in which a magnification scale of 350 may be relevant, is Actinic Patterned Mask Inspection, in which an only slightly resolved image of the mask is recorded, and in which various regions of the mask that have identical structures are compared with one another and checked for differences.

The illumination light 1 is reflected at the object 5. The plane of incidence of the illumination light lies parallel to the yz plane.

The EUV illumination light 1 is produced by an EUV light source 6. The light source 6 may be a laser plasma source (LPP; laser produced plasma) or a discharge source (DPP; discharge produced plasma). In principle, a synchrotron-based light source may also be used, for example a free electron laser (FEL). A used wavelength of the EUV light source may lie in the range between 5 nm and 30 nm. In principle, in the case of a variant of the metrology system 2, a light source for another used wavelength may also be used instead of the light source 6, for example a light source for a used wavelength of 193 nm.

Depending on the configuration of the metrology system 2, it may be used for a reflecting object 5 or for a transmitting object 5. An example of a transmitting object is a phase mask.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle distribution, with which the field points of the object field 3 are illuminated.

Figure 2:
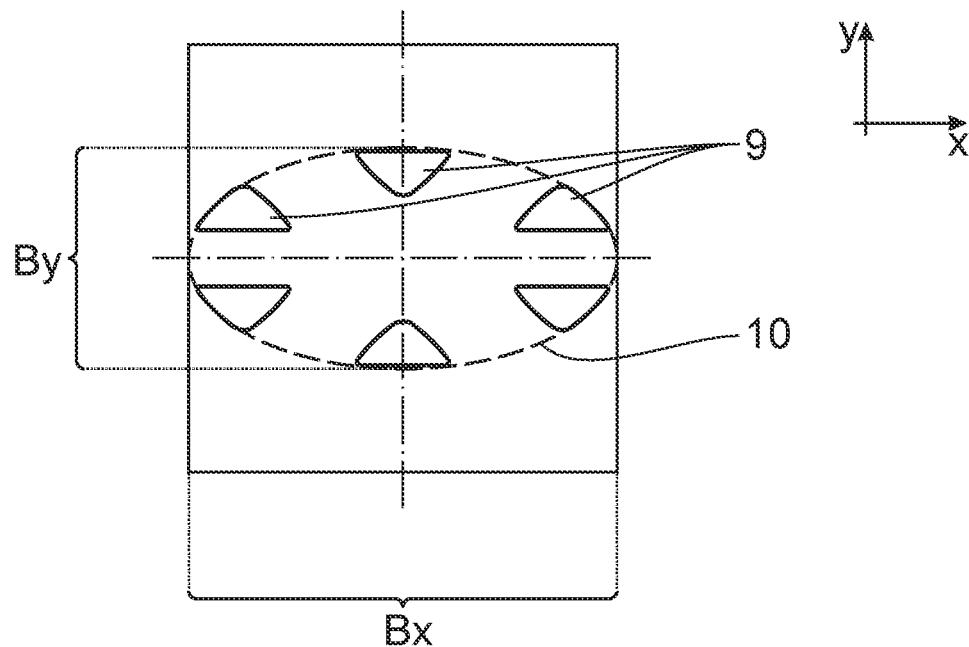
FIG. 2 shows an illumination setting, that is to say an intensity distribution of illumination light in a pupil plane of the illumination optical unit, for an illumination of the object.

FIG. 2 shows a corresponding illumination setting, which can be set for the illumination optical unit 7. Represented in FIG. 2 is an intensity distribution of the illumination light 1 in a pupil plane 8 (cf. FIG. 1) or in a plane of the illumination optical unit 7 conjugate thereto. The illumination setting takes the form for example of a hexapole setting with six illumination poles 9.

The six illumination poles 9 lie within an elliptical outer edge contour 10, which is indicated in a dashed manner in FIG. 2. This edge contour 10 follows an ellipse with a ratio between the major semiaxis parallel to the x axis and the minor semiaxis parallel to the y axis of 2:1. Other axis ratios of the elliptical edge contour 10 in the range from 10:1 to 1.1:1 are also possible, for example of 1.5:1, 1.6:1, 2.5:1, 3:1, 4:1, 5:1 or 8:1.

The elliptical edge contour 10 is produced by an illumination aperture stop 11 of the illumination optical unit 7, which marginally delimits a beam of the illumination light 1 that is incident on the illumination aperture stop 11. Correspondingly, in a stop plane extending parallel to the xy plane, the illumination aperture stop 11 has in the two mutually perpendicular directions x and y two stop diameters that differ from one another by at least 10%, in the present case by 100%, the corresponding equivalents of which are denoted in FIG. 2 by Bx and By. The illumination aperture stop 11 has the greater stop diameter Bx perpendicular to the plane of incidence yz of the illumination light 1 on the object 5.

The metrology system 2 is designed for the examination of anamorphic masks with different structure scaling factors in x and y. Such masks are suitable for producing semiconductor elements by use of anamorphic projection apparatuses.

A numerical aperture of the illumination and imaging light 1 in the xz plane may be 0.125 on the reticle side and in the yz plane 0.0625 on the reticle side.

Figure 3:
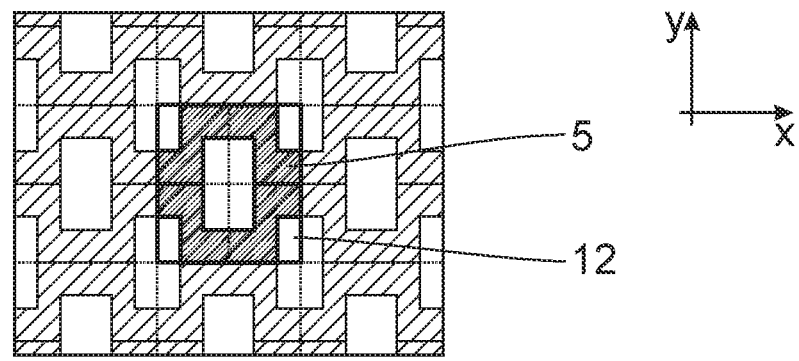
FIG. 3 shows a plan view of the object to be imaged.

FIG. 3 shows a plan view of the object 5. Structures on the reticle 5 are stretched in the y direction by a factor of 2. This means that a partial structure, for example the rectangular structure 12 in the lower right-hand corner of the object 5 shown in FIG. 3, which is intended to be imaged in a 1:1 structure, has an x/y aspect ratio of 1:2.

After reflection at the object 5, the illumination and imaging light 1 enters an imaging optical unit or projection optical unit 13 of the metrology system 2, which in FIG. 1 is likewise schematically indicated by a dashed border. The imaging optical unit 13 serves for imaging the object 5 towards a spatially resolving detection device 14 of the metrology system 2. The detection device 14 is designed for example as a CCD detector.

Figure 4:
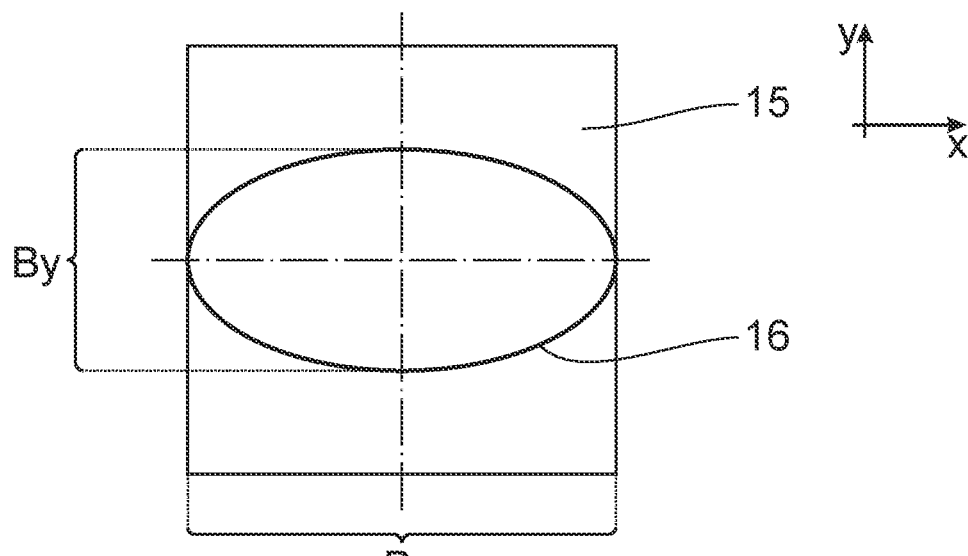
FIG. 4 shows a plan view of an imaging aperture stop for the marginal delimitation of an imaging light beam in the imaging optical unit.

The imaging optical unit 13 comprises an imaging aperture stop 15 arranged downstream of the object 5 in the beam path (cf. also FIG. 4) for the marginal delimitation of an imaging light beam. The imaging aperture stop 15 is arranged in a pupil plane 8a of the imaging optical unit 13. The pupil planes 8 and 8a may coincide; this is not mandatory however.

The imaging aperture stop 15 has an elliptical edge contour 16 with an x/y semiaxis ratio of, e.g., 2:1. Therefore, in a stop plane extending parallel to the xy plane, the imaging aperture stop 15 has in two mutually perpendicular directions x, y two stop diameters that differ from one another by at least 10%, which are in turn denoted in FIG. 4 by Bx and By. What was said above with respect to the corresponding diameter ratio of the illumination aperture stop 11 applies to the diameter ratio Bx:By in the range between 10:1 and 1.1:1.

The imaging aperture stop 15 also has the greater stop diameter Bx perpendicular to the plane of incidence yz of the illumination and imaging light 1 on the object 5. Also in the case of the imaging aperture stop 15, the diameter Bx is twice the diameter By.

The detection device 14 is in signaling connection with a digital image processing device 17.

The object 5 is carried by an object holder 18. This object holder can be displaced by a displacement drive 19 on the one hand parallel to the xy plane and on the other hand perpendicularly to this plane, that is to say in the z direction. The displacement drive 19, as also the entire operation of the metrology system 2, is controlled by a central control device 20, which, in a way that is not represented any more specifically, is in signaling connection with the components to be controlled.

The optical set-up of the metrology system 2 serves during use as an Aerial Image Metrology System for the most exact possible emulation of an illumination and an imaging in the course of a projection exposure of the object 5 during the projection-lithographic production of semiconductor devices.

Figure 5:
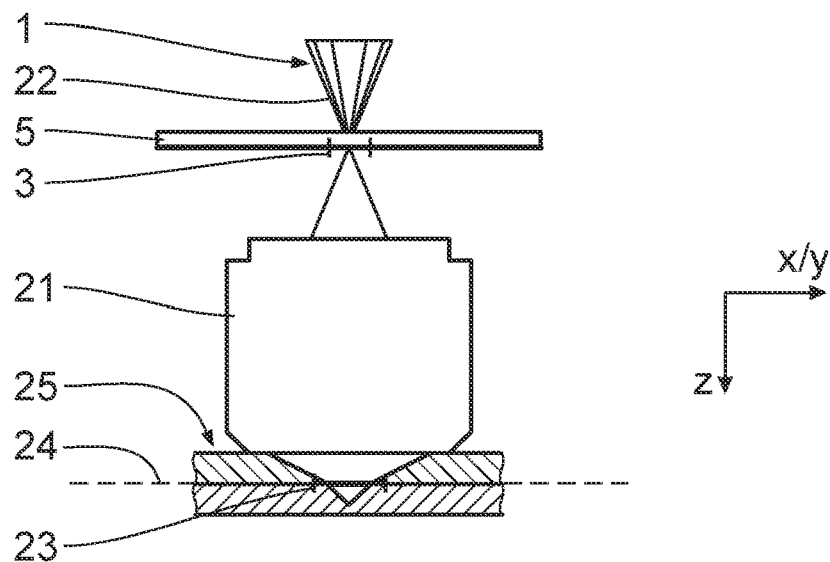
FIG. 5 shows less schematically than in FIG. 1 a side view of an arrangement of a lithographic projection optical unit between the object to be imaged and a wafer, the object being the one that was examined in advance with the metrology system shown in FIG. 1.

FIG. 5 shows the imaging ratios of a lithographic projection optical unit 21 that is used during such a lithographic projection exposure. As a difference from FIG. 1, FIG. 5 shows a transmitting illumination of the object 5 instead of the actually occurring reflecting illumination. A structuring of this illumination light beam 22 on the basis of a defined illumination setting with discrete illumination poles is indicated in an illumination light beam 22 of the illumination and imaging light 1.

The projection optical unit 21, which is part of a projection exposure apparatus that is not otherwise represented, is of an anamorphic configuration, and therefore has a different imaging scale in the xz plane than in the yz plane. For example, an object-side numerical aperture of the projection optical unit 21 is 0.125 in the xz plane and 0.0625 in the yz plane. An image-side numerical aperture of the projection optical unit 21 is 0.5 both for the xz plane and for the yz plane. This gives an imaging scale of 4× in the xz plane and an imaging scale of 8× in the yz plane, that is to say a reduction factor on the one hand of 4 and on the other hand of 8. For the magnification factors $\beta_x$, $\beta_y$, it is therefore the case that: $\beta_x=1/4$ and $\beta_y=1/8$.

During the projection exposure, the projection optical unit 21 projects an image of the object field 3 into an image field 23 in an image plane 24, in which a wafer 25 is arranged.

As a difference from the projection optical unit 21 of the projection exposure apparatus, the projection optical unit 13 of the metrology system 2 is not anamorphic, but instead has the same magnifying imaging scale $\beta_{MS}$ of more than 100, for example of 500 or of 850, both in the xz plane and in the yz plane. The projection optical unit 13 of the metrology system is therefore isomorphic.

Figure 6:
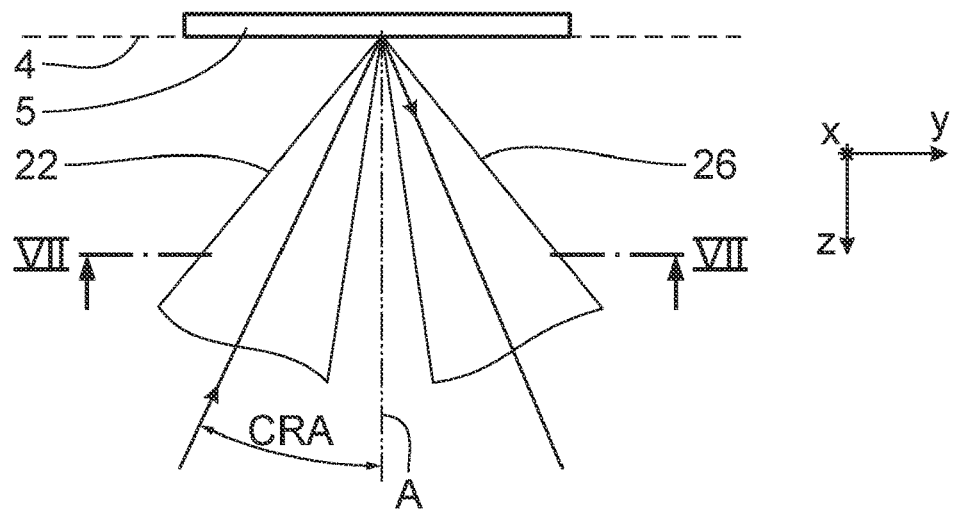
FIG. 6 shows schematically in a section in a plane of incidence a reflection of the illumination and imaging light at the object during the projection exposure.
Figure 7:
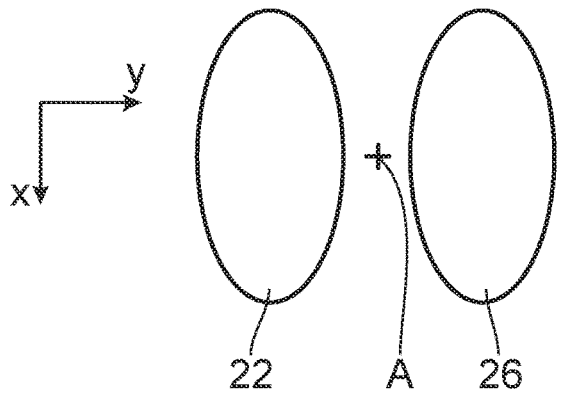
FIG. 7 shows a section through the incident illumination light beam and the emerging imaging light beam according to line VII-VII in FIG. 6.

FIGS. 6 and 7 illustrate the reflection ratios when using an illumination with an elliptical edge contour, which can then be used in the reflection of an anamorphic projection optical unit adapted correspondingly thereto, such as the projection optical unit 21, or an optical unit with an elliptical imaging aperture stop, as in the case of the projection optical unit 13. On account of the elliptical cross section on the one hand of the illumination light beam 22 and on the other hand of an imaging light beam 26 reflected by the object 5, a small chief-ray angle of incidence CRA of 6° or less can be realized, since the light beams 22, 26 respectively have the same numerical aperture in the yz plane of 0.0625. In the xz plane perpendicular thereto, the light beams 22 and 26 have the greater numerical aperture of 0.125, which does not cause any disturbance there.

A central axis, from which the chief-ray angle CRA is measured and which is perpendicular to the object plane 4, is denoted in FIGS. 6 and 7 by A.

Data that can be used to deduce an imaging behavior of the structure of the object 5 that is illuminated in the object field 3 by the projection optical unit 21 in the region of the image plane 24 are generated during the 3D aerial-image measurement. For this purpose, the metrology system 2 is used, the imaging scale ratio of 2:1 of the projection optical unit 21 in the two mutually perpendicular directions y and x, that is to say in the two mutually perpendicular planes yz and xz, being taken into account by using a metrology system projection optical unit 13 that is not anamorphic. This may take place computationally.

Figure 8:
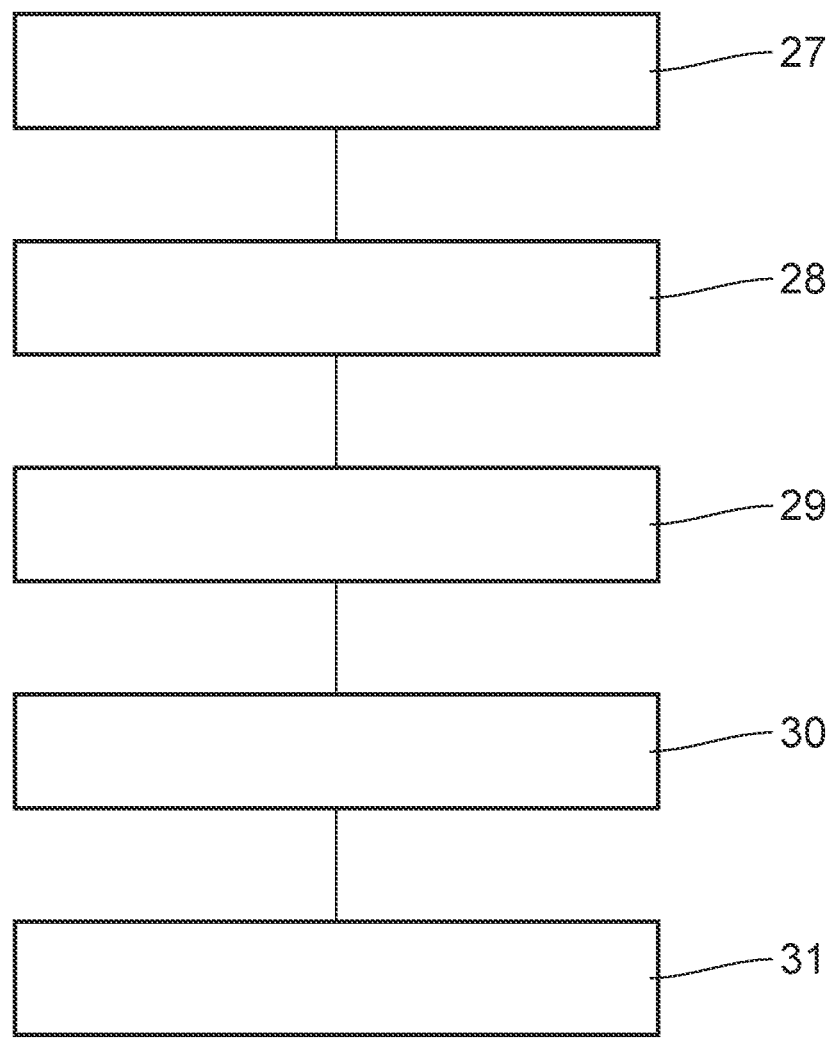
FIG. 8 shows a flow diagram of a method for three-dimensionally measuring a 3D aerial image in the region around the image plane during the imaging of the lithography mask.

The method for 3D aerial-image measurement is explained below on the basis of FIGS. 8 and 9.

First, the object 5 to be measured, that is to say the lithography mask to be measured, is provided in a step 27. Then, the intensity distribution of the imaging light 1 is measured in the region of an image plane 14a in an image field 14b, in which the detection device 14 of the metrology system 1 is arranged. This takes place in a measuring step 28. In the measuring step 28, the detection device 14 detects a 2D imaging-light intensity distribution within a detection field, into which an image of the object field 3 is projected by the projection optical unit 13 of the metrology system. The measured intensity distribution is then in each case stored and passed on to the digital image processing device 17.

Then the lithography mask 5 is displaced with the aid of the displacement drive 19 perpendicularly to the object plane 4 by a predetermined displacement Δz. This takes place in a displacement step 29.

The measuring step 28 and the displacement step 29 are then repeated by carrying out a repetition step 30 as often as is needed until a sufficient number of 2D imaging-light intensity distributions to reproduce a 3D aerial image are measured by use of the detection device 14. By repeating the measuring step 28 and the displacement step 29 for different z positions of the object 5, the 2D imaging-light intensity distribution is therefore measured for example at five, seven, nine or eleven positions, each lying Δz apart, the object 5 lying exactly in the object plane 4 in the case of a midway displacement step 29. In FIG. 1, corresponding displacement z positions of the object 5 are indicated in a dash-dotted manner. The case in which five z positions, each lying Δz apart, are measured is shown, the z position that is shown in FIG. 1, in which the object 5 lies in the object plane 4, representing the middle of the five z positions to be measured.

In the case of this measuring method, the third dimension of the 3D aerial image, to be specific the z dimension, is made accessible to the measurement by z displacement of the object 5.

By repeating steps 28 to 30, a stack of 2D imaging-light intensity distributions respectively differing by a Δz displacement of the test structure is therefore measured in the region of the plane 14a with the detection device 14. This takes place with the imaging aperture stop 15 used, shown in FIG. 4.

In an output step 31, a resultant 3D aerial image is output.

Figure 9:
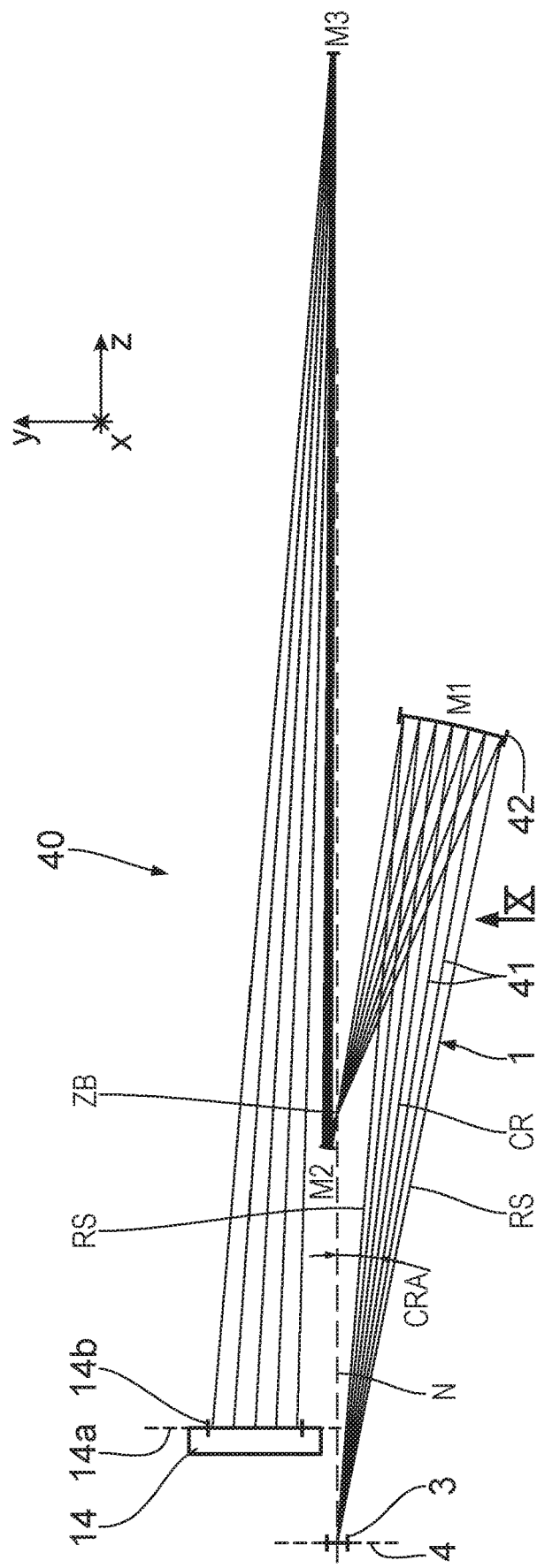
FIG. 9 shows in a meridional section a configuration of an imaging optical unit or projection optical unit for use in the metrology system shown in FIG. 1.
Figure 10:
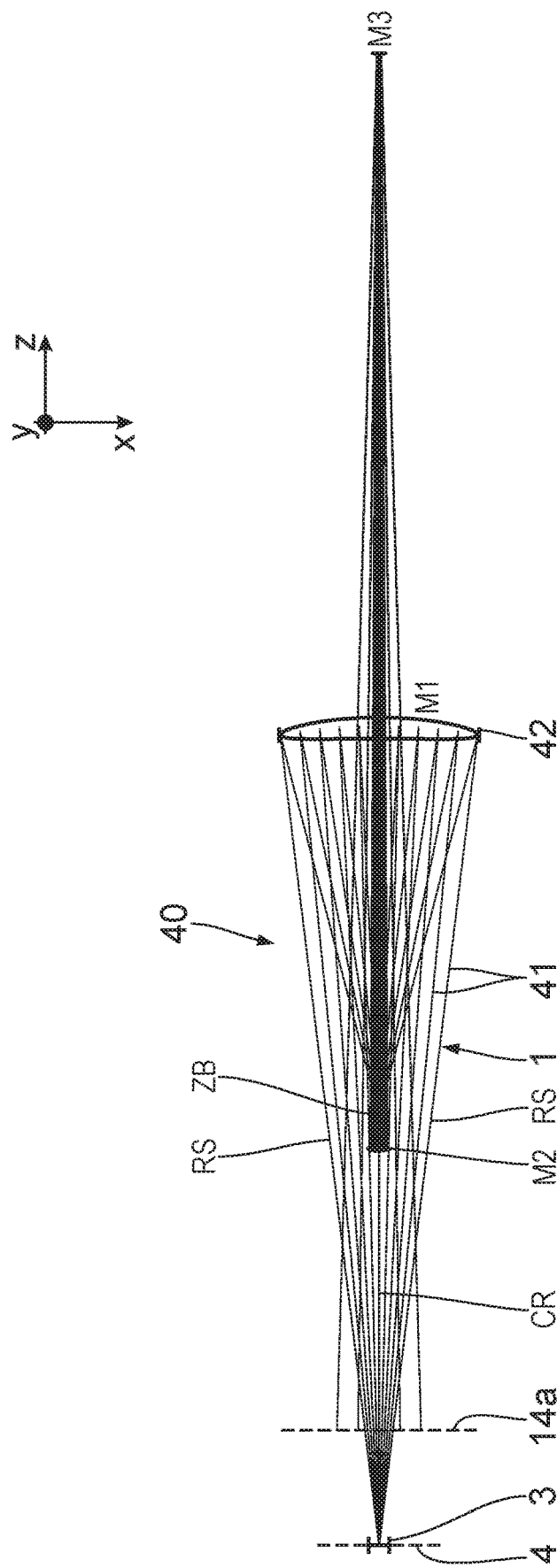
FIG. 10 shows a view from viewing direction X in FIG. 9.
Figure 11:
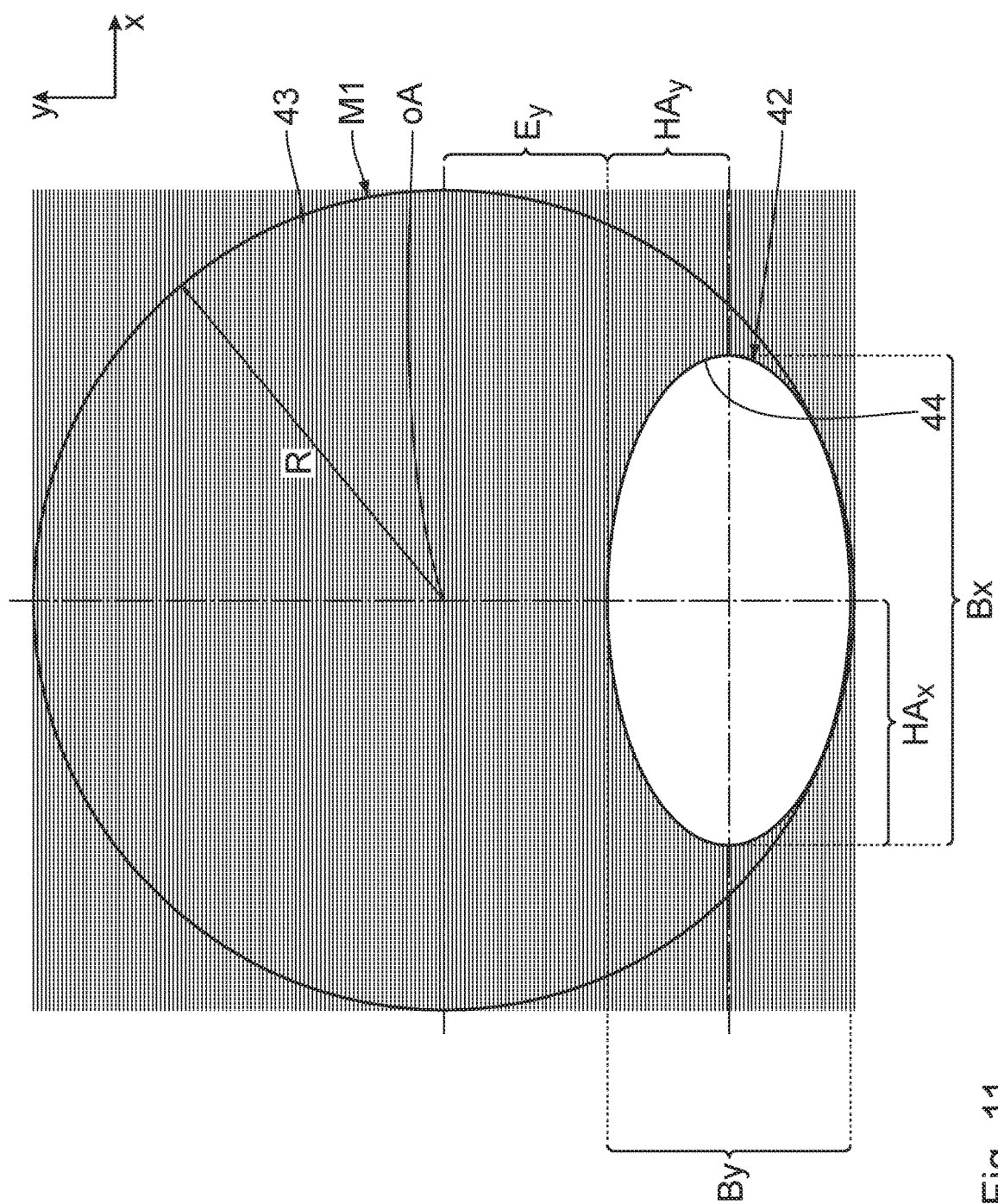
FIG. 11 shows a plan view of a parent surface of a first mirror in an imaging light beam path of the imaging optical unit shown in FIG. 9, a reflection surface that is used for the reflection of the imaging light and is marginally delimited by an imaging aperture stop being highlighted.

A configuration of a projection optical unit 40, which can be used in the metrology system 2 instead of the projection optical unit 13, is explained on the basis of FIGS. 9 to 11. Components and functions which have already been explained above with reference to FIGS. 1 to 8 bear the same reference signs and will not be explained in detail again.

In some implementations, the projection optical unit 40 is isomorphic and has a magnification factor $\beta_x=\beta_y=\beta_{MS}$ of 350. The object field 3 is therefore magnified by a factor of 350 and projected as an image into the image field 14b of the projection optical unit 40 in the image plane 14a.

For example, the projection optical unit 40 is configured as a mirror optical unit and has precisely three mirrors M1, M2 and M3 in the beam path of the imaging light 1. In the FIGS. 9 and 10, the path of some individual rays 41 of the imaging light 1 between the object field 3 and the image field 14b are represented by way of example. Among the rays shown are marginal rays or coma rays RS and a chief ray CR of a central field point.

For example, the chief ray CR has on the object field side a chief-ray angle CRA in relation to a normal N to the object plane 4 that is 8°.

For example, the mirrors M1 to M3 have reflection surfaces that are portions of rotationally symmetric parent surfaces. These parent surfaces can be described by the following aspheric equation (1):

$$z(h) = \frac{\rho h^2}{1+\sqrt{(1-(1+K)\rho^2 h^2}} + Ah^4 \qquad (1)$$

where ρ is the curvature of the mirror reflection surface (ρ=1/R with R: the radius of curvature of the reflection surface). It is also the case that $h^2=x^2+y^2$ (h: the distance of the point under consideration on the reflection surface from the optical axis, that is to say the axis of rotational symmetry of the reflection parent surface). z is the sagittal height of the reflection surface at the location h. K is the conic constant.

The following table shows examples of the optical design data of the projection optical unit 40. In the "surface" column, the surfaces or mirrors of the projection optical unit are indicated. The "radius" column shows the radius of curvature R of the respective surface. The "distance" column indicates the distance of the respective surface from the next surface in the z direction. The mirror M1 is for example at a distance from the object plane 4 in the positive z direction of approximately 724 mm. The "operating mode" column indicates that the mirrors M1 to M3 are operated reflectively. The coefficients K and A should be entered in the above aspheric equation (1) for the calculation of the form of the reflection surfaces of the mirrors M1 to M3.

TABLE 1

(FIGS. 9 to 11)

| Surface | Radius | Distance | Operating mode | K | A |
| --- | --- | --- | --- | --- | --- |
| Object plane | infinite | 724.7161632 | | | |
| M1 | −471.707187 | −380.3609 | REFL | −1.3332E−01 | 6.8181E−13 |
| M2 | 59.6237982 | 955.5756088 | REFL | −1.4905E+00 | 5.9659E−07 |
| M3 | 113.8817037 | −1199.84907 | REFL | −1.8481E+01 | 1.2151E−06 |
| Image plane | infinite | 0 | | | |

For example, the mirror M1 is concave. The mirror M2 is concave. The mirror M3 is convex.

In comparison with the dimension of the reflection surface of the mirror M1 that is used, the dimensions of the reflection surfaces of the mirrors M2 and M3 that are used are very small. The reflection surfaces of the mirrors M2 and M3 are significantly smaller than, e.g., one tenth of the reflection surface of the mirror M1.

Arranged on the mirror M1 is an imaging aperture stop 42, which is used instead of the imaging aperture stop 15 of the projection optical unit 13 shown in FIG. 1. A circular parent surface 43 of the mirror M1 is illustrated in FIG. 11 together with the imaging aperture stop 42. The mirror M1 is used for reflecting the imaging light 1 exclusively within an edge contour 44 of the imaging aperture stop 42. This edge contour 44 is elliptical. A ratio of semiaxes $HA_x/HA_y$ of the edge contour 44 is exactly 2. Correspondingly, an object-side numerical aperture $NA_y$ of the projection optical unit 40 in the yz plane (compare FIG. 9) is exactly half the size of an object-side numerical aperture $NA_x$ in the xz plane (compare FIG. 10). The following applies: $NA_x$=0.12 and $NA_y$=0.06.

In the imaging light beam path between the mirrors M1 and M2, the projection optical unit 40 has an intermediate image ZB. The intermediate image ZB is arranged near the reflection of the imaging light 1 on the mirror M2.

In some implementations, the imaging aperture stop 42 is arranged decentered with respect to the optical axis oA, which passes centrally through the parent surface 43 and represents an axis of rotational symmetry of the parent surface 43. A distance $E_y$ of the edge contour 44 from the optical axis oA is greater than the minor semiaxis $HA_y$. The distance $E_y$ of the edge contour 44 from the optical axis oA is less than the major semiaxis $HA_x$.

For example, the maximum wavefront error rms over the image field 14b at the projection optical unit 40 is approximately 55 mλ.

The object field 3 is square and has an extent of 200 μm×200 μm.

The greater stop diameter $2HA_x$=Bx of the imaging aperture stop 42 lies perpendicularly to the plane of incidence yz of the imaging light 1 on the reflecting object 5 in the object field 3.

Figure 12:
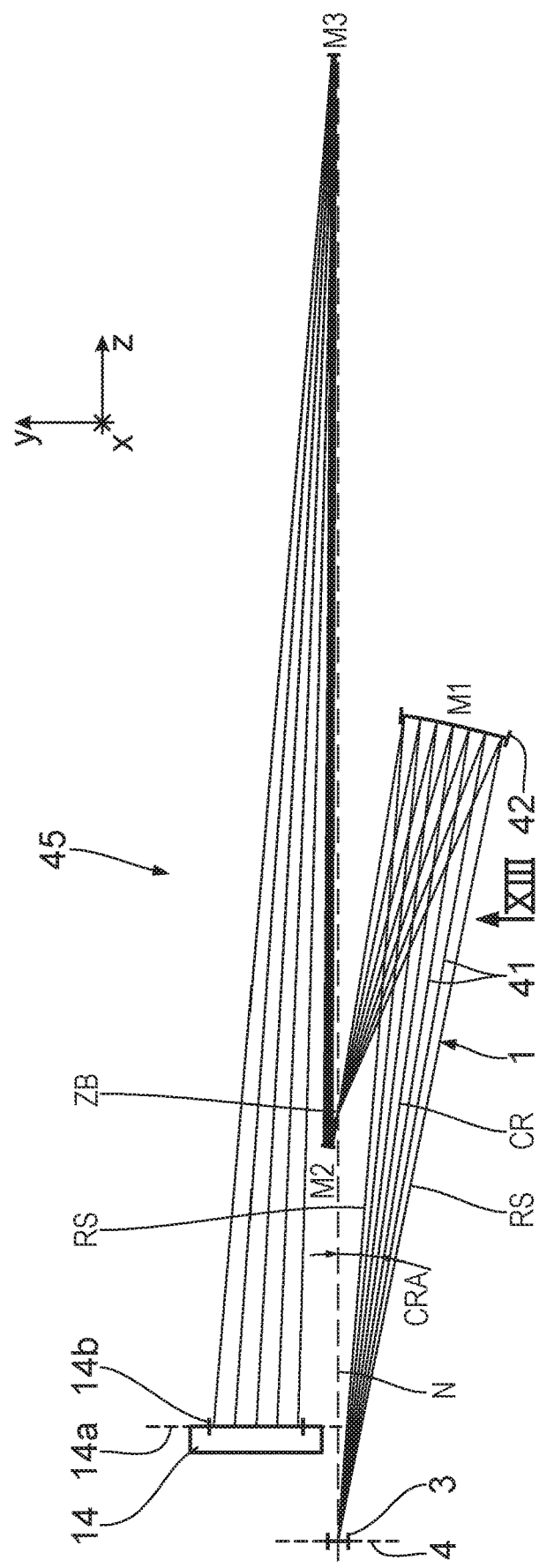
FIGS. 12 and 13 show representations similar to FIGS. 9 and 10 of a further configuration of the imaging optical unit.
Figure 13:
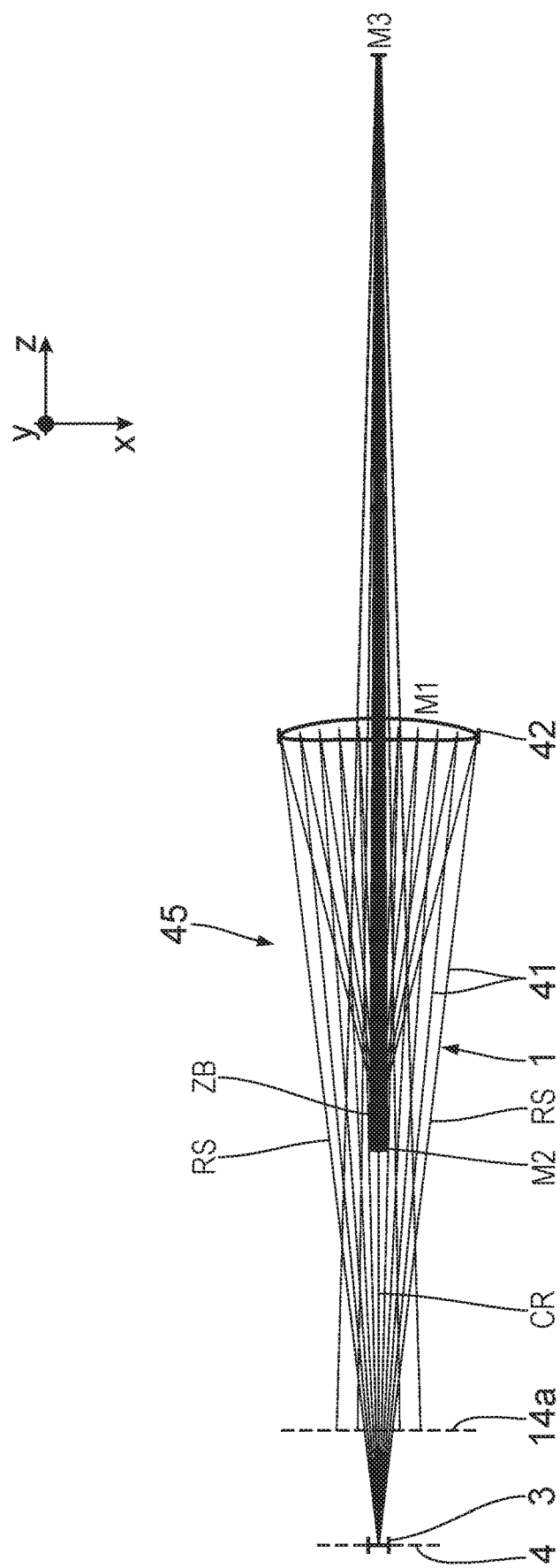

A further configuration of a projection optical unit 45, which can be used in the metrology system 2 instead of the projection optical unit 40, is explained below on the basis of FIGS. 12 and 13. Components which have already been explained above with reference to FIGS. 1 to 11, and in particular with reference to FIGS. 9 to 11, bear the same reference signs and are not discussed in detail again.

In the case of the projection optical unit 45, the arrangement of the imaging aperture stop 42 within the parent surface 43 of the mirror M1 is exactly as explained above in connection with FIG. 11 and the projection optical unit 40 shown in FIGS. 9 to 11.

For example, a wavefront error rms of the projection optical unit 45 over the image field 14b is less than 40 mλ.

Examples of the optical design data of the projection optical unit 45 are provided in the following Table 2, the layout of which corresponds to Table 1 above.

TABLE 2

| | (FIGS. 12 and 13) | | | | |
|---|---|---|---|---|---|
| Surface | Radius | Distance | Operating mode | K | A |
| Object plane | infinite | 724.7161632 | | | |
| M1 | −470.618831 | −386.944702 | REFL | −1.3703E−01 | 9.7519E−13 |
| M2 | 74.15451386 | 962.2282986 | REFL | −1.5014E+00 | 3.1711E−07 |
| M3 | 89.29603749 | −1199.98299 | REFL | −9.1238E+00 | 1.0284E−06 |
| Image plane | infinite | 0 | | | |

A further embodiment of a projection optical unit 46, which can be used in the metrology system 2 instead of the projection optical unit 40, is explained in the following text on the basis of FIGS. 14 and 16. Components which have already been explained above with reference to FIGS. 1 to 13, and in particular with reference to FIGS. 9 to 13, bear the same reference signs and are not discussed in detail again.

For example, in the case of the projection optical unit 46, an object-side chief-ray angle CRA is 5°, therefore 3° smaller than in the case of the projection optical units 40 and 45 explained above.

In comparison with the radius R (compare FIG. 16) of the parent surface 43 of the mirror M1 of the projection optical unit 46, the semiaxes $HA_x$, $HA_y$ of the edge contour 44 of the imaging aperture stop 42 are greater in the case of the projection optical unit 46 than in the case of the projection optical unit 40. Also in the case of the projection optical unit 46, the semiaxis ratio is $HA_x/HA_y$=2.

In the case of the projection optical unit 46, a distance $E_y$ of the edge contour 44 of the aperture stop 42 of the mirror M1 of the projection optical unit 46 is smaller than the minor semiaxis $HA_y$.

On account of the smaller chief-ray angle CRA of 5°, smaller imaging light convolution angles can be realized in particular on the mirrors M1 and M2 of the projection optical unit 46. This leads to smaller angles of incidence of the imaging light 1 on the mirrors M1 to M3, and correspondingly to smaller reflection losses and reflection inhomogeneities.

Examples of the optical design data of the projection optical unit 46 are provided by the following Table 3, the layout of which corresponds to Tables 1 and 2 above.

TABLE 3

Figure 14:
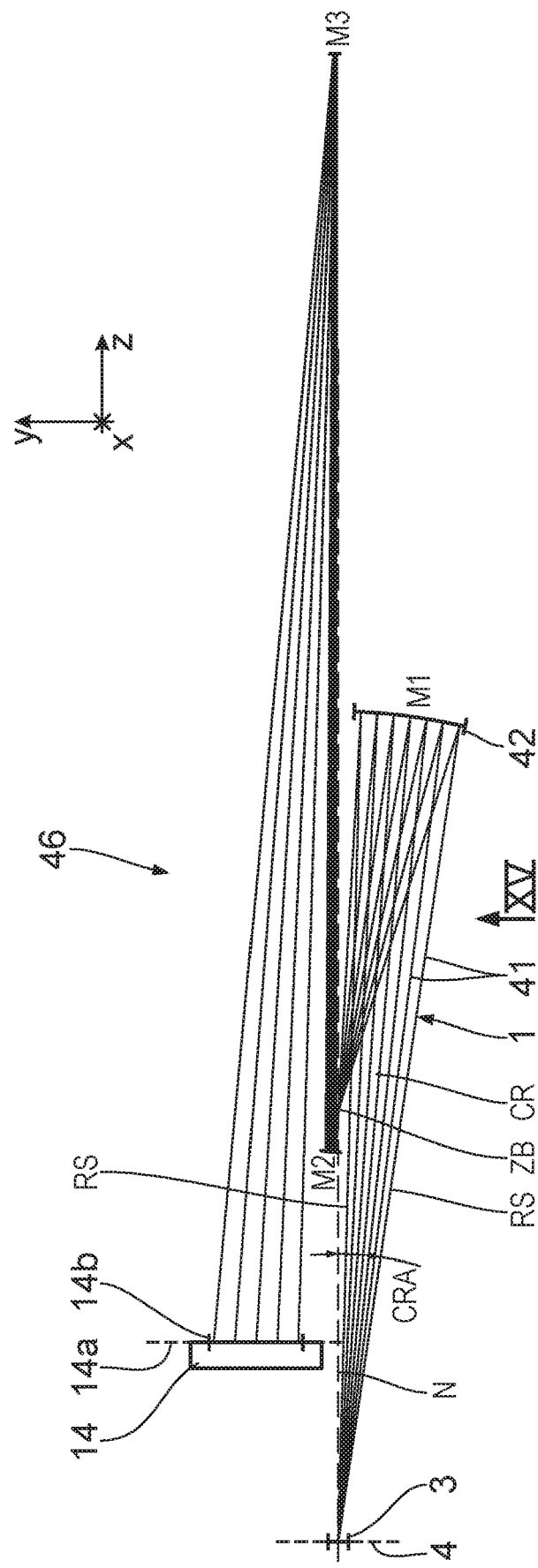
FIGS. 14 to 16 show representations similar to FIGS. 9 to 11 of a further configuration of the imaging optical unit.
Figure 15:
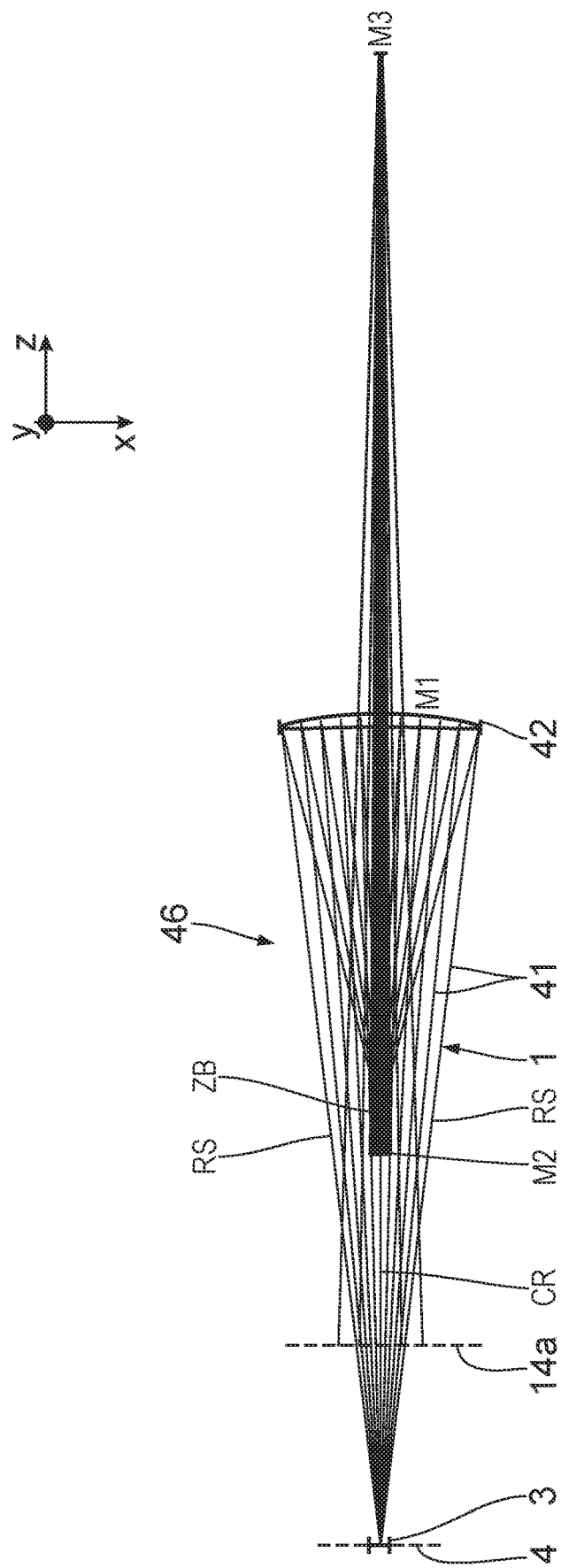
Figure 16:
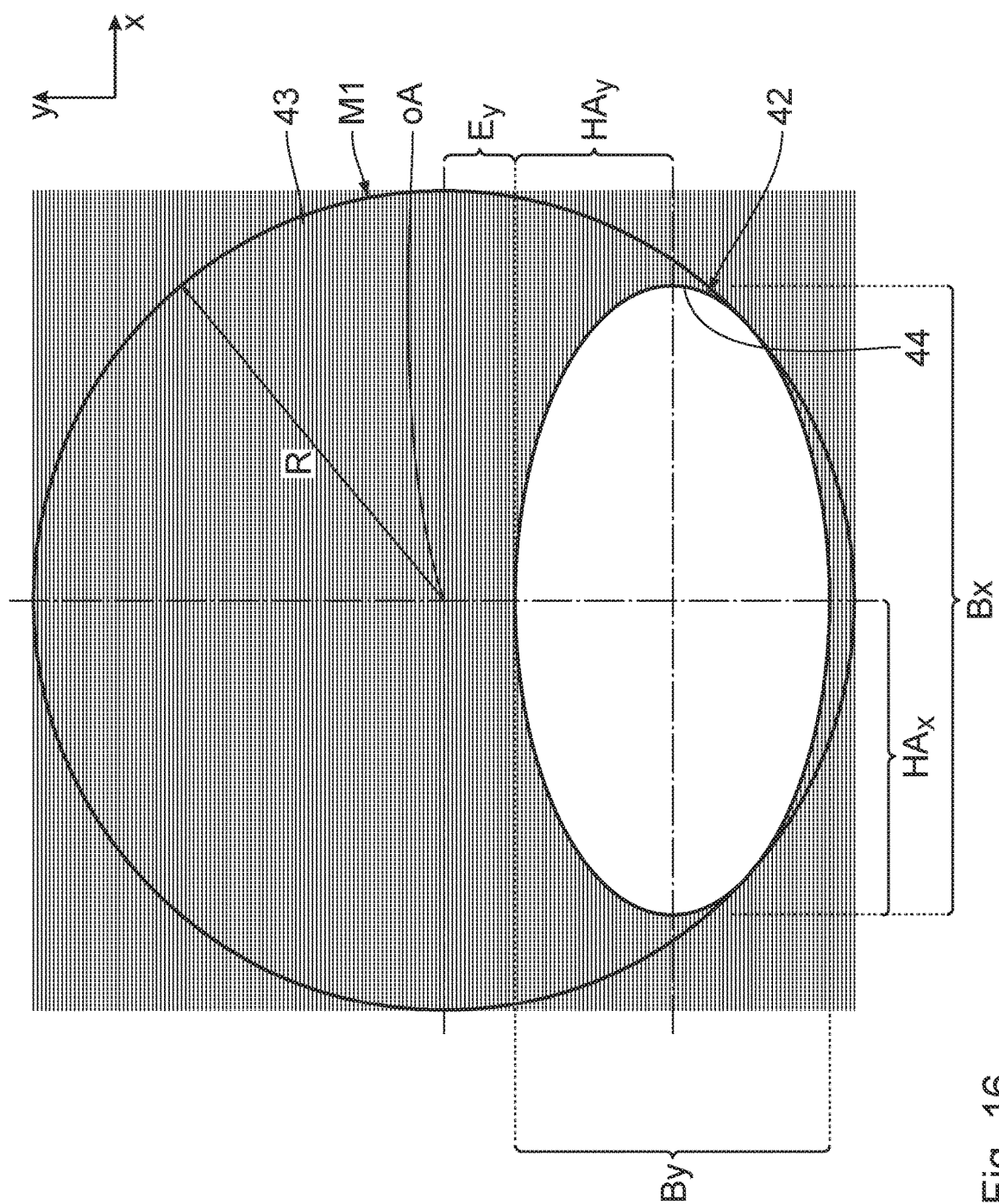

(FIGS. 14 to 16)

| Surface | Radius | Distance | Operating mode | K | A |
|---|---|---|---|---|---|
| Object plane | infinite | 724.7161632 | | | |
| M1 | −469.78806 | −384.351949 | REFL | −1.3528E−01 | 3.7219E−12 |
| M2 | 71.01885038 | 959.6391299 | REFL | −1.1024E+00 | 2.2366E−07 |
| M3 | 87.21218748 | −1126.10514 | REFL | −4.3127E+00 | 2.1218E−07 |
| Image plane | infinite | 0 | | | |

For example, a wavefront error rms of the projection optical unit 46 over the image field 14*b* is less than 35 mλ.

A further embodiment of a projection optical unit 47, which can be used in the metrology system 2 instead of the projection optical unit 40, is explained in the following text on the basis of FIGS. 17 and 19. Components which have already been explained above with reference to FIGS. 1 to 16, and in particular with reference to FIGS. 9 to 16, bear the same reference signs and are not discussed in detail again.

In some implementations, the projection optical unit 47 is anamorphic. It is the case that: $\beta_x=350$ and $\beta_y=175$. The imaging scale $\beta_x$ in the direction of the object field coordinate x therefore differs from the imaging scale $\beta_y$ in the direction of the object field coordinate y. As already stated above, the projection optical unit of the projection exposure apparatus in which the reticle 5 that is being measured with the imaging optical unit 47 is used has the imaging scales $\beta_x=1/4$ and $\beta_y=1/8$. In the comparison of the imaging scale ratio $\beta_x/\beta_y$, it is generally the case that:

$$(\beta_x/\beta_y)_{metrology\ system} = (\beta_x/\beta_y)^{-1}_{projection\ exposure\ apparatus}.$$

For example, the mirrors M1, M2 and M3 of the projection optical unit 47 have reflection surfaces for the imaging light 1 that are configured as free-form surfaces. The following free-form surface equation (2) applies in this case:

$$Z = \frac{\rho_x x^2 + \rho_y y^2}{1+\sqrt{1-(1+k_x)(\rho_x x)^2 - (1+k_y)(\rho_y y)^2}} + \quad (2)$$

$$C_1 x + C_2 y + C_3 x^2 + C_4 xy + C_5 y^2 + C_6 x^3 + \ldots +$$

$$C_9 y^3 + C_{10} x^4 + \ldots + C_{12} x^2 y^2 + \ldots + C_{14} y^4 + C_{15} x^5 +$$

$$\ldots + C_{20} y^5 + C_{21} x^6 + \ldots + C_{24} x^3 y^3 + \ldots + C_{27} y^6 + \ldots$$

The following applies to the parameters of this equation (2): Z is the sagittal height of the free-form surface at the point x, y, where $x^2+y^2=h^2$. h here is the distance from the reference axis of the free-form surface equation $(x=0; y=0).$ In the free-form surface equation (2), $C_1$, $C_2$, $C_3$ . . . denote the coefficients of the free-form surface series expansion in powers of x and y.

In the case of a conical base area, $\rho_x$, $\rho_y$ is a constant corresponding to the vertex curvature of a corresponding asphere. Thus, $\rho_x=1/R_x$ and $\rho_y=1/R_y$. $k_x$ and $k_y$ each correspond to a conic constant of a corresponding asphere. Thus, equation (2) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and the gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

Examples of the optical design data of the free-form reflection surfaces of the mirrors M1 to M3 of the projection optical unit 47 can be taken from the following Tables 4 to 6. Table 4 corresponds in terms of its layout to Tables 1 to 3 explained above.

Table 4 therefore prescribes the design data of a rotationally symmetric basic form of the respective three-from surface.

Table 5 indicates bending values ADE, BDE and CDE for the respective surfaces. The bending value ADE indicates an angle of rotation of the respective coordinate system after passing through the respective surface. The coordinate system is in this case respectively turned by an angle that corresponds to twice the ADE value. The coordinate system consequently follows the path of a chief ray of a central field point. The ADE value for the object plane is for example in terms of absolute value half the object-side chief-ray angle CRA.

Table 6 indicates the coefficients that should be entered in the above free-form surface equation (2) to result in the respective free-form reflection surface of the mirror M1, M2, M3.

TABLE 4

Figure 17:
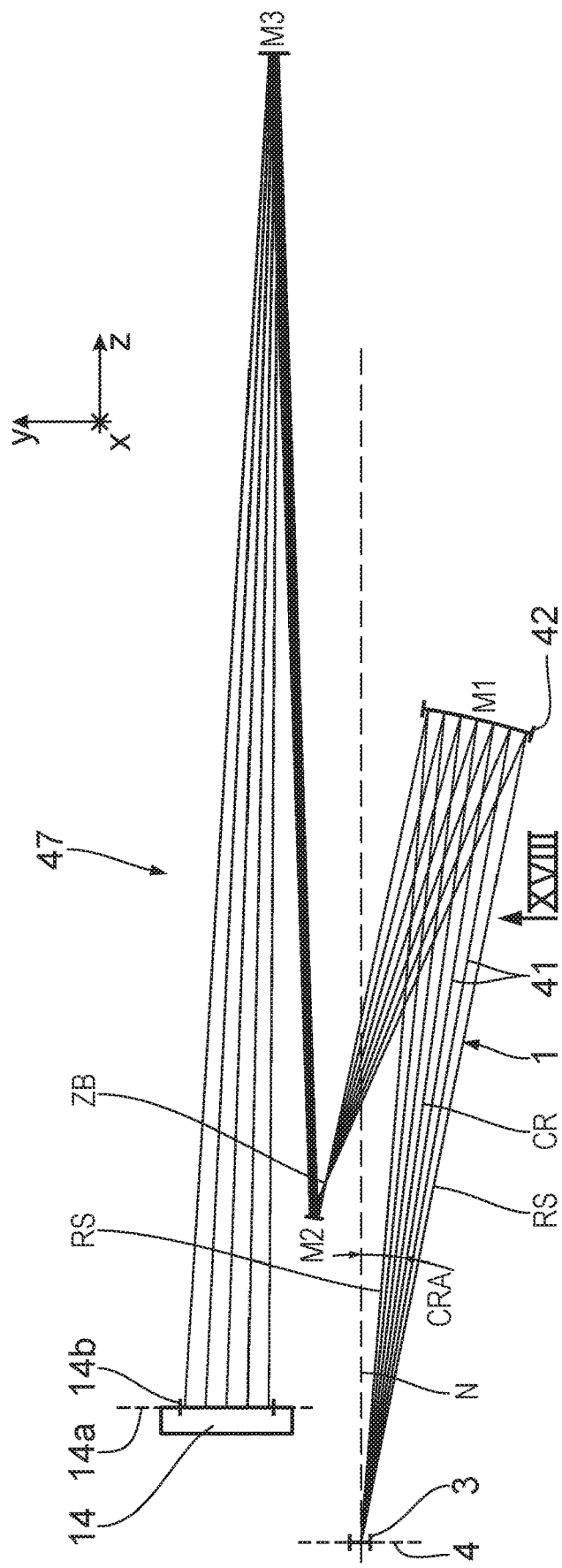
FIGS. 17 to 19 show in representations similar to FIGS. 9 to 11 a further configuration of the imaging optical unit.
Figure 18:
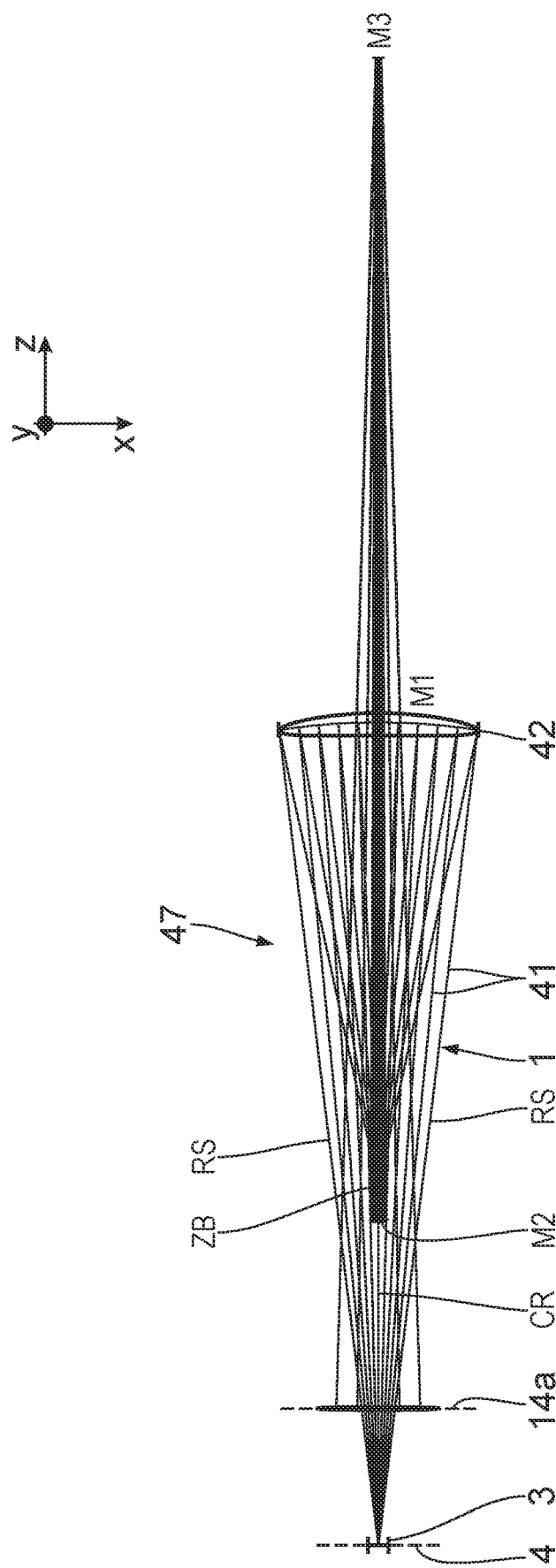
Figure 19:
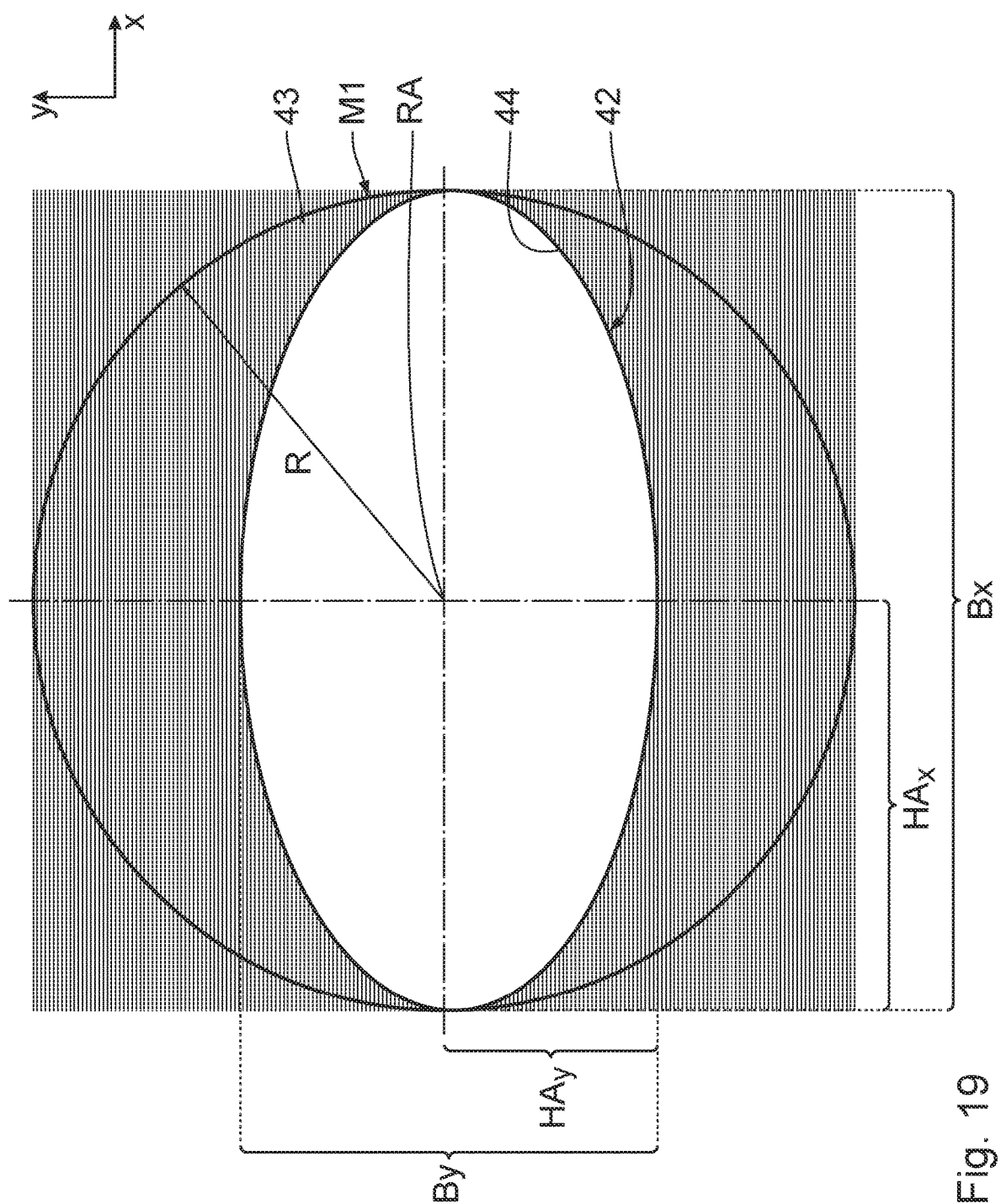

(FIGS. 17 to 19)

| Surface | Radius (RY) | Distance | Operating mode |
|---|---|---|---|
| Object plane | infinite | 7.24716E+02 | |
| M1 | −5.00484E+02 | −4.57694E+02 | REFL |
| M2 | 6.99426E+01 | 1.01615E+03 | REFL |
| M3 | −7.21895E+02 | −1.17944E+03 | REFL |
| Image plane | infinite | 0 | |

TABLE 5

(FIGS. 17 to 19)
Bending

| Surface | ADE | BDE | CDE |
|---|---|---|---|
| Object plane | −4 | 0 | 0 |
| M1 | −5 | 0 | 0 |
| M2 | 10 | 0 | 0 |
| M3 | −2 | 0 | 0 |
| Image plane | 3.55733E+00 | 0 | 0 |

TABLE 6

(FIGS. 17 to 19)

| Coefficient | M1 | M2 | M3 |
|---|---|---|---|
| RX | −4.67909E+02 | −6.43558E+01 | 1.02790E+02 |
| KY | 1.83985E−01 | −1.09933E+01 | −1.46349E+03 |
| KX | 3.96033E−03 | −1.08126E+01 | −2.01422E+01 |
| C1 | 0.00000E+00 | 0.00000E+00 | 0.00000E+00 |
| C2 | 5.44550E−04 | −7.17948E−03 | −1.49574E−03 |
| C3 | 1.32948E−04 | 4.19785E−04 | −1.34925E−03 |
| C4 | 0.00000E+00 | 0.00000E+00 | 0.00000E+00 |
| C5 | 6.90137E−05 | 5.21390E−04 | 2.30188E−03 |
| C6 | 0.00000E+00 | 0.00000E+00 | 0.00000E+00 |
| C7 | −4.35061E−08 | −1.16468E−05 | −3.00552E−06 |
| C8 | 0.00000E+00 | 0.00000E+00 | 0.00000E+00 |
| C9 | −4.32437E−08 | −1.10257E−05 | −1.44689E−06 |
| C10 | 4.69483E−10 | 4.96057E−06 | 1.95974E−06 |
| C11 | 0.00000E+00 | 0.00000E+00 | 0.00000E+00 |
| C12 | 9.04087E−10 | 8.89473E−06 | 2.89533E−06 |
| C13 | 0.00000E+00 | 0.00000E+00 | 0.00000E+00 |
| C14 | 4.32473E−10 | 3.99137E−06 | −5.28255E−07 |
| C15 | 0.00000E+00 | 0.00000E+00 | 0.00000E+00 |
| C16 | −1.08523E−13 | −1.97866E−09 | −2.08598E−09 |
| C17 | 0.00000E+00 | 0.00000E+00 | 0.00000E+00 |
| C18 | −2.14905E−13 | −3.69767E−09 | −5.34575E−09 |
| C19 | 0.00000E+00 | 0.00000E+00 | 0.00000E+00 |
| C20 | −1.07610E−13 | −6.34883E−10 | 1.70751E−09 |
| C21 | 1.70930E−15 | −4.60986E−09 | 0.00000E+00 |
| C22 | 0.00000E+00 | 0.00000E+00 | 0.00000E+00 |
| C23 | 5.10424E−15 | −1.23034E−08 | 0.00000E+00 |
| C24 | 0.00000E+00 | 0.00000E+00 | 0.00000E+00 |
| C25 | 5.07732E−15 | −1.09856E−08 | 0.00000E+00 |
| C26 | 0.00000E+00 | 0.00000E+00 | 0.00000E+00 |
| C27 | 1.61794E−15 | −3.49828E−09 | 0.00000E+00 |

For example, with respect to the meridional plane yz, the free-form surfaces of the mirrors M1 to M3 are mirror-symmetrical.

A comparison of the "radius" values (=RY) in Table 4 above and "RX" in Table 6 above for the three mirrors M1 to M3 shows that the reflection surfaces of these mirrors M1 to M3 have to some extent greatly differing basic curvatures. The basic curvatures RY and RX also differ in sign in the case of the mirrors M2 and M3, so here there are in each case saddle-shaped base areas.

The object field 3 of the projection optical unit 47 is rectangular and has dimensions along the x dimension and along the y dimension of 200 μm×400 μm. Together with the anamorphic magnification scales $\beta_x$, $\beta_y$, this gives a square image field 14b.

For example, the maximum wavefront error rms over the image field 14b at the projection optical unit 47 is approximately 45 mλ.

In the case of the projection optical unit 47, the chief-ray angle CRA is 8°.

In the case of the projection optical unit 47 (compare FIG. 19), the imaging aperture stop 42 lies on a reference axis RA of the current surface 43 of the mirror M1. The reference axis RA passes through an (x, y) coordinate origin of the mathematical free-form surface representation of the free-form parent surface 43. At the same time, the reference axis RA marks a point of incidence of a chief ray of a central field point of the imaging light 1 on the mirror M1 with the aperture stop 42.

A large stop diameter Bx of the aperture stop 42 of the projection optical unit 47 along the semiaxis $HA_x$ is exactly the same size as the diameter R2 of the parent surface 43. The ratio $HA_x/HA_y=2$ also applies in the case of the projection optical unit 47.

A further embodiment of a projection optical unit 48, which can be used in the metrology system 2 instead of the projection optical unit 40, is explained in the following text on the basis of FIGS. 20 to 22. Components which have already been explained above with reference to FIGS. 1 to 19, and in particular with reference to FIGS. 9 to 19, bear the same reference signs and are not discussed in detail again.

In some implementations, as a difference from the three-mirror configurations of the projection optical units 40, 45, 46 and 47, the projection optical unit 48 has altogether five mirrors M1 to M5, which are consecutively numbered in the order in which they occur in the imaging light beam path between the object field 3 and the image field 14b.

For example, in the case of the projection optical unit 48, a two-stage imaging process takes place. A first mirror group 49 of the projection optical unit 48 comprises the mirrors M1 and M2 and has an anamorphic imaging effect. The imaging scale $\beta_x$ is 2. The imaging scale $\beta_y$ is 1. If a mask or reticle 5 of which the structures in they direction are twice the size of those in the x direction is used, this first mirror group 49 produces a distorted image, in which the structures in the y direction are the same size as in the x direction.

For example, a second mirror group 50 comprising the mirrors M3 to M5 is designed as a microscope optical unit with an isomorphic imaging scale $\beta_x=\beta_y=350$.

Between the two mirror groups 49 and 50, a first intermediate image ZB1 lies between the mirrors M2 and M3. A further intermediate image ZB2 lies between M3 and M4.

The aperture stop 42 (cf. FIG. 22) lies on the mirror M1.

In a case of an alternative design, an aperture stop is not arranged on the mirror M1 but on the mirror M3. In this case, the aperture stop may be of a virtually circular configuration.

For mounting a focus stack (cf. steps 28 to 30 described above), when using the projection optical unit 48 it is not the reticle 5 that is displaced but the second mirror group 50 in the z direction, whereby a correspondingly defocused image of the intermediate image ZB1 is obtained.

A z displacement for the second mirror group 50 lies in the range of several μm to several tens of μm, since, as already explained above, the first mirror group 49 does not have any appreciable magnification, but merely distorts the image of the object 5.

For example, in the case of a configuration that is not described any more specifically with regard to its optical design, the two mirrors M1 and M2 of the first mirror group 49 are configured as free-form surfaces and the mirrors M3 to M5 of the second mirror group 50 are configured as rotationally symmetric surfaces, the reflection surfaces of which can be described in a way corresponding to the above aspheric equation (1).

Examples of the design data of a configuration of the projection optical unit 48, in which all five mirrors M1 to M5 are configured as free-form surfaces, are shown below.

The optical design data of the free-form reflection surfaces of the mirrors M1 to M5 of the projection optical unit 48 can be taken from the following Tables 7 ff., the layout of which corresponds to Tables 4 to 6 above, relating to the projection optical unit 47.

TABLE 7

Figure 20:
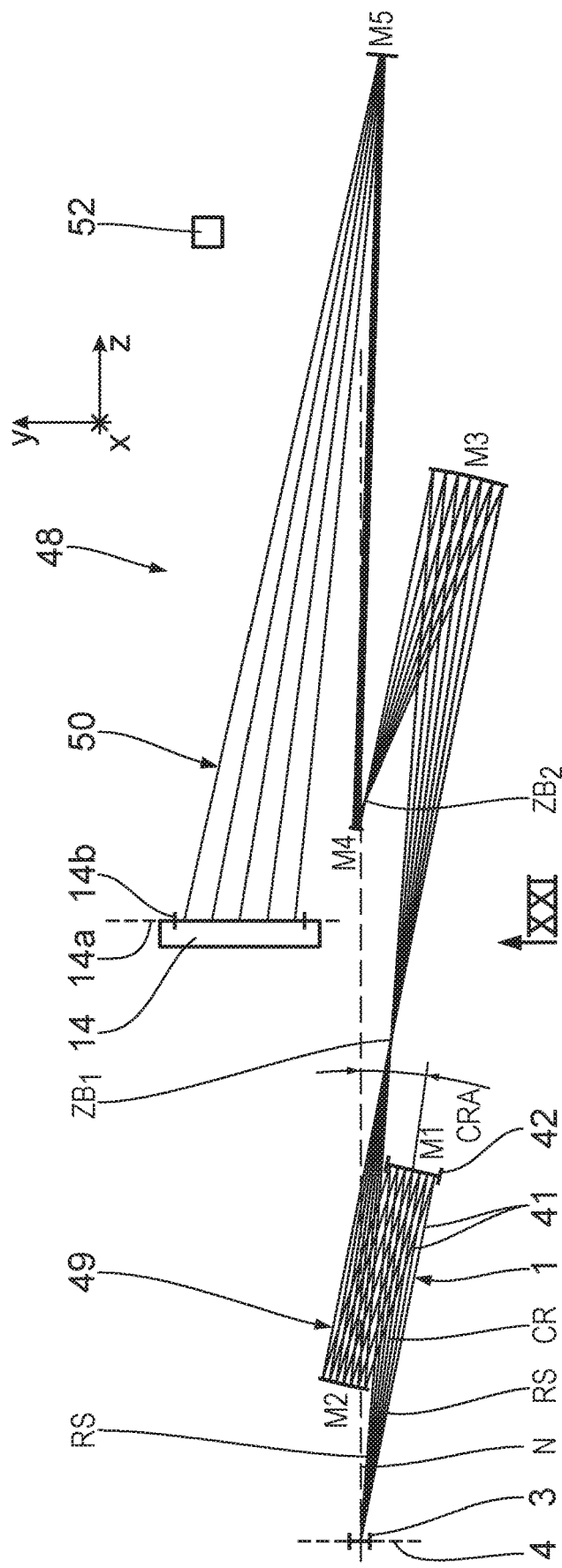
FIGS. 20 to 22 show in representations similar to FIGS. 9 and 11 a further configuration of the imaging optical unit.
Figure 21:
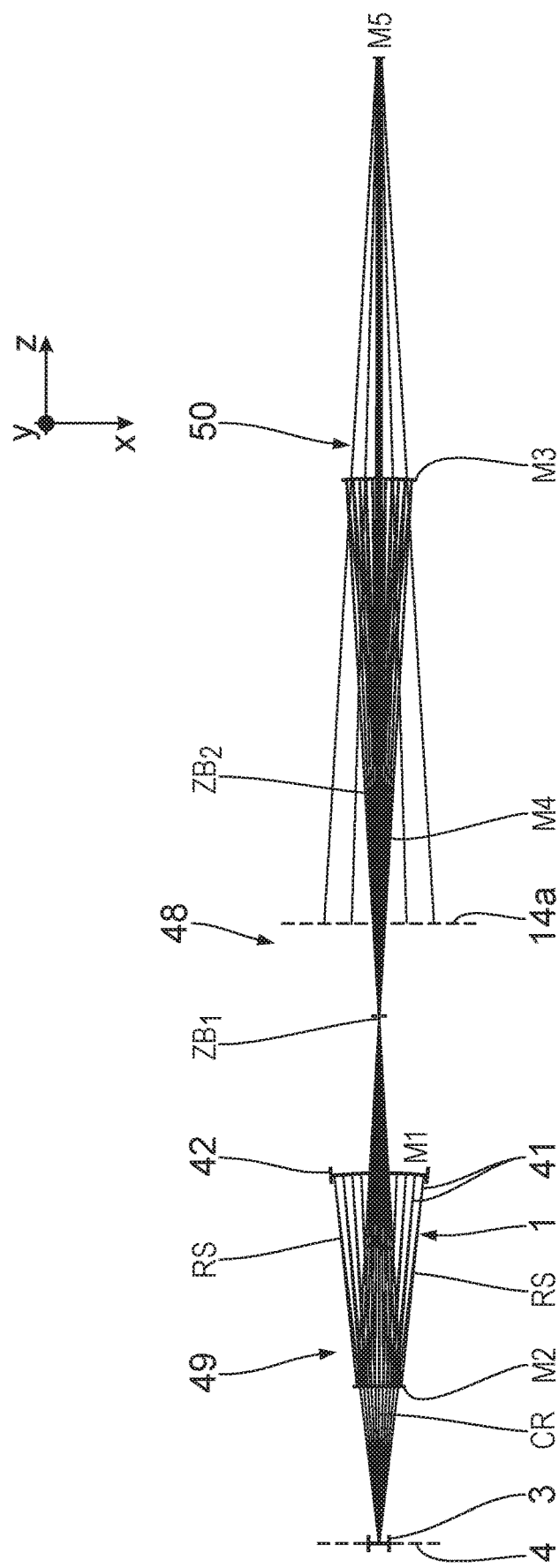
Figure 22:
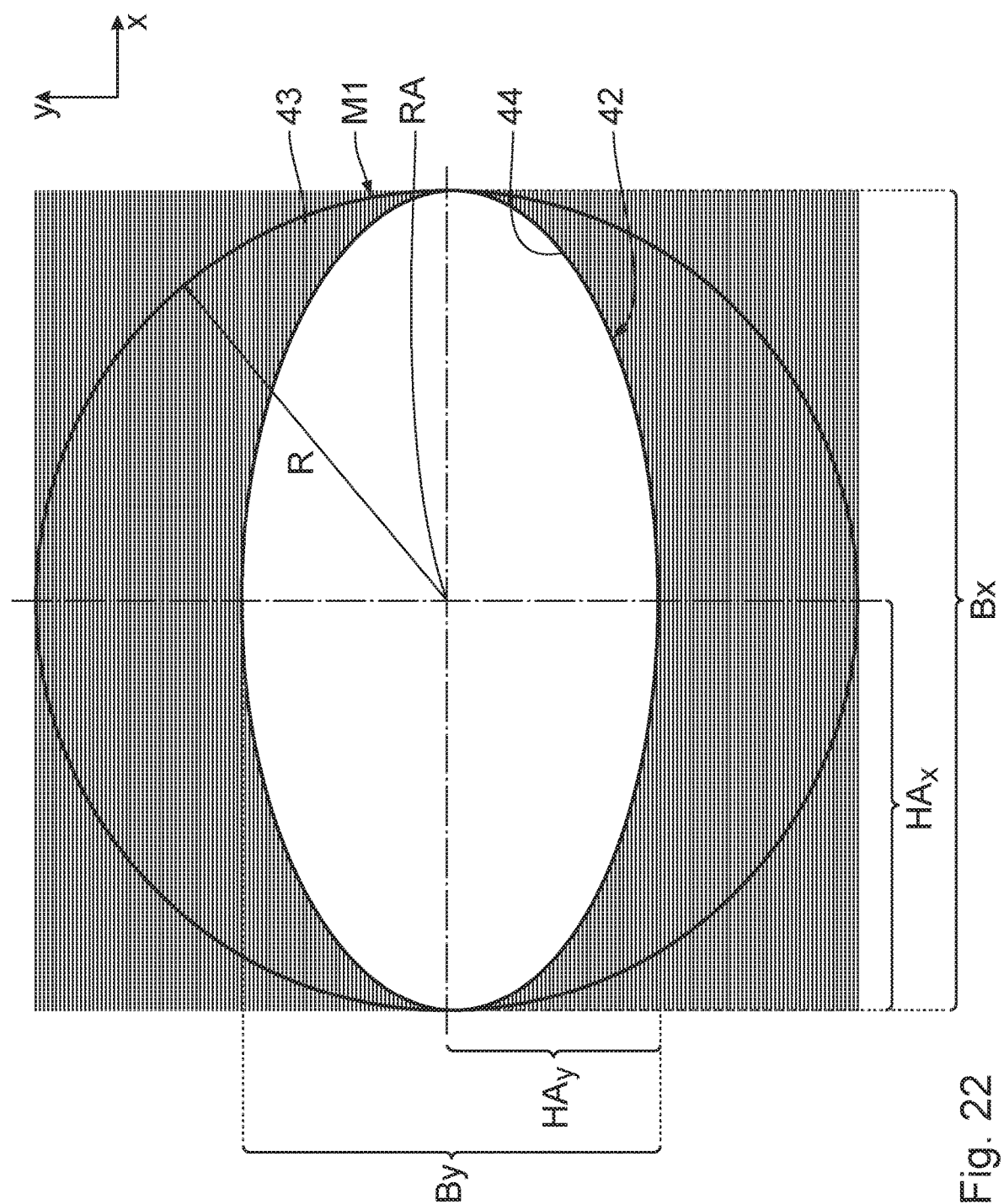

(FIGS. 20 to 22)

| Surface | Radius (RY) | Distance | Operating mode |
|---|---|---|---|
| Object plane | infinite | 7.24716E+02 | |
| M1 | −4.87394E+02 | −1.50000E+02 | REFL |
| M2 | 5.02858E+02 | 2.50000E+02 | REFL |
| M3 | −2.55401E+02 | −2.47331E+02 | REFL |
| M4 | 4.63460E+01 | 5.17450E+02 | REFL |
| M5 | 7.86836E+02 | −5.82453E+02 | REFL |
| Object plane | infinite | 0 | |

TABLE 8

(FIGS. 20 to 22)
Bending

| Surface | ADE | BDE | CDE |
|---|---|---|---|
| Object plane | −4 | 0 | 0 |
| M1 | −5 | 0 | 0 |
| M2 | 5 | 0 | 0 |
| M3 | −5 | 0 | 0 |
| M4 | 8 | 0 | 0 |
| M5 | −2 | 0 | 0 |
| Image plane | 2.54689E+00 | 0 | 0 |

TABLE 9

(FIGS. 20 to 22)
Coefficient

| Object plane | M1 | M2 | M3 | M4 | M5 |
|---|---|---|---|---|---|
| RY | −4.87394E+02 | 5.02858E+02 | −2.55401E+02 | 4.63460E+01 | 7.86836E+02 |
| RX | −2.71741E+02 | −7.04992E+02 | −2.31820E+02 | 40.9051161 | 74.9103609 |
| KY | −3.76E+00 | −9.19E+00 | −6.00E−01 | −1.29E+01 | 8.44E+03 |
| KX | 1.10862E+00 | 7.39904E+01 | −1.44081E+00 | −1.72E+01 | −2.70E+02 |
| C1 | 0.00E+00 | 0.00E+00 | 0.00E+00 | 0.00E+00 | 0.00E+00 |
| C2 | −3.98E−05 | 2.54E−04 | 9.17E−05 | −2.23E−03 | 1.85E−02 |
| C3 | −3.50E−06 | 3.01E−05 | 3.44E−04 | −1.01E−03 | 3.49E−03 |
| C4 | 0.00E+00 | 0.00E+00 | 0.00E+00 | 0.00E+00 | 0.00E+00 |
| C5 | −3.06E−05 | 1.17E−05 | 2.06E−04 | 2.16E−03 | 8.40E−03 |
| C6 | 0.00E+00 | 0.00E+00 | 0.00E+00 | 0.00E+00 | 0.00E+00 |
| C7 | 3.28E−06 | 8.15E−06 | 1.91E−06 | −3.78E−04 | −5.84E−05 |
| C8 | 0.00E+00 | 0.00E+00 | 0.00E+00 | 0.00E+00 | 0.00E+00 |
| C9 | −1.07E−06 | −2.09E−06 | 1.88E−07 | −2.11E−04 | −4.32E−05 |
| C10 | 1.63E−09 | −5.56E−08 | −7.72E−09 | 3.29E−05 | 7.77E−05 |
| C11 | 0.00E+00 | 0.00E+00 | 0.00E+00 | 0.00E+00 | 0.00E+00 |
| C12 | 1.67E−08 | 1.14E−08 | −2.49E−08 | 5.23E−05 | −1.95E−05 |
| C13 | 0.00E+00 | 0.00E+00 | 0.00E+00 | 0.00E+00 | 0.00E+00 |
| C14 | −1.07E−08 | 1.18E−09 | −1.84E−09 | 2.08E−05 | −3.90E−06 |
| C15 | 0.00E+00 | 0.00E+00 | 0.00E+00 | 0.00E+00 | 0.00E+00 |
| C16 | 1.43E−11 | 4.88E−10 | −1.77E−12 | −3.17E−08 | −3.23E−08 |
| C17 | 0.00E+00 | 0.00E+00 | 0.00E+00 | 0.00E+00 | 0.00E+00 |
| C18 | −5.30E−12 | −2.99E−10 | 8.49E−11 | −1.98E−07 | 3.53E−07 |
| C19 | 0.00E+00 | 0.00E+00 | 0.00E+00 | 0.00E+00 | 0.00E+00 |
| C20 | 1.96E−11 | −4.20E−11 | 1.69E−12 | −1.80E−07 | −1.19E−07 |
| C21 | 1.39E−13 | −1.07E−12 | −9.51E−14 | −1.43E−07 | −1.90E−06 |
| C22 | 0.00E+00 | 0.00E+00 | 0.00E+00 | 0.00E+00 | 0.00E+00 |
| C23 | −2.11E−14 | 1.35E−12 | −1.85E−13 | −3.01E−07 | 8.77E−07 |
| C24 | 0.00E+00 | 0.00E+00 | 0.00E+00 | 0.00E+00 | 0.00E+00 |
| C25 | −7.88E−13 | −2.08E−13 | −3.08E−13 | −1.25E−07 | −1.39E−07 |
| C26 | 0.00E+00 | 0.00E+00 | 0.00E+00 | 0.00E+00 | 0.00E+00 |
| C27 | −2.41E−13 | −5.74E−13 | 0.00000E+00 | −3.91E−08 | 3.74E−08 |

The positioning and form of the imaging aperture stop 42 on the mirror M1 in the case of the projection optical unit 48 correspond to those of the imaging aperture stop 42 of the projection optical unit 47.

For example, in the case of the projection optical unit 48, the chief-ray angle CRA is 8°.

The displacement may be performed with the aid of a motorized displacement drive 52, which is shown schematically in FIG. 20. The displacement drive 52 may be a linear motor. The displacement drive 52 is mechanically connected to the three mirrors M3, M4 and M5 of the second group 50, which is not shown in FIG. 20.

An imaging with the metrology system 2 may be carried out with an elliptical imaging aperture stop 15, but alternatively also with an oval stop or, particularly in the case of the actinic inspection of a structured mask, with a rectangular stop. If no phase reconstruction is carried out, it is necessary to use an imaging aperture stop with an x/y aspect ratio that corresponds to the ratio of the imaging scale in the x and y directions of an imaging optical unit to be emulated or to be reconstructed, that is to say has for example an aspect or diameter ratio in the range between 10:1 and 1.1:1.

On account of the different major axis lengths $HA_x$, $HA_y$, an aspect ratio Bx/By of the aperture stop 42 in the direction of the two object field coordinates x and y differs from 1. As already explained above in connection with the imaging aperture stop 15, this aspect ratio Bx/By may lie in the range between 10:1 and 1.1:1.

What is claimed is:

1. An imaging optical unit for a metrology system for examining a lithography mask, wherein the lithography mask can be arranged in an object field of the imaging optical unit, the object field being defined by two mutually perpendicular object field coordinates, the imaging optical unit comprising:
  an aperture stop of which the aspect ratio in the direction of the two object field coordinates differs from 1, in which the aperture stop is arranged on a mirror of the imaging optical unit, and the mirror is configured to reflect imaging light within an edge contour of the aperture stop; and
  at least four mirrors, which are arranged in an imaging-light path between the object field and an image field,
  wherein the imaging optical unit comprises an isomorphic configuration in which an imaging scale in the direction of one of the two object field coordinates does not differ from an imaging scale in the direction of the other of the two object field coordinates.

2. The imaging optical unit as claimed in claim 1, wherein the object field has a typical dimension of at least 200 μm.

3. The imaging optical unit as claimed in claim 1, wherein the aperture stop comprises an elliptical aperture stop.

4. The imaging optical unit as claimed in claim 1, wherein the imaging optical unit has a wavefront error (rms) that is less than 100 mλ.

5. The imaging optical unit as claimed in claim 1, wherein a chief-ray angle (CRA) of a central object field point of the imaging optical unit is at most 8°.

6. The imaging optical unit as claimed in claim 1, comprising at least two mirror groups, one of the mirror groups being of an anamorphic configuration and the other of the mirror groups being of an isomorphic configuration.

7. The imaging optical unit of claim 1 in which the imaging optical unit has an imaging scale of at least 100, and a pattern on the lithography mask at the object field is magnified at least 100 times at the image field.

8. The imaging optical unit of claim 1 in which the aperture stop comprises at least one of an oval aperture stop or a rectangular aperture stop that is arranged on the mirror.

9. An imaging optical unit for a metrology system for examining a lithography mask
  wherein the lithography mask can be arranged in an object field of the imaging optical unit, the object field being defined by two mutually perpendicular object field coordinates,
    comprising an anamorphic configuration in which an imaging scale in the direction of one of the two object field coordinates differs from an imaging scale in the direction of the other of the two object field coordinates.

10. The imaging optical unit as claimed in claim 9, wherein at least one mirror of the imaging optical unit has a reflection surface for imaging light that is formed as a free-form surface.

11. The imaging optical unit as claimed in claim 9, wherein the aperture stop is arranged on a mirror of the imaging optical unit.

12. The imaging optical unit as claimed in claim 11, wherein a center of the aperture stop lies on a reference axis (RA) of a mirror reflection surface of the imaging optical unit.

13. The imaging optical unit as claimed in claim 9, wherein the imaging optical unit has exactly three mirrors in a beam path of imaging light between the object field and the image field.

14. A metrology system for examining a lithography mask, comprising:
  an illumination optical unit for illuminating the lithography mask to be examined,
  an imaging optical unit in which the lithography mask can be arranged in an object field of the imaging optical unit, the object field being defined by two mutually perpendicular object field coordinates, the imaging optical unit comprising:
    an aperture stop of which the aspect ratio in the direction of the two object field coordinates differs from 1; and
    at least four mirrors, which are arranged in an imaging-light path between the object field and an image field, and
  a spatially resolving detection device, arranged in an image field of the imaging optical unit.

15. The metrology system as claimed in claim 14, comprising a configuration for examining a reflecting lithography mask, wherein the aperture stop has a greater stop diameter that is perpendicular to the plane of incidence of illumination light on the lithography mask.

16. The metrology system as claimed in claim 14, wherein the imaging optical unit comprises an isomorphic configuration in which an imaging scale in the direction of one of the two object field coordinates does not differ from an imaging scale in the direction of the other of the two object field coordinates.

17. The metrology system as claimed in claim 14, wherein the object field has a typical dimension of at least 200 μm.

18. The metrology system as claimed in claim 14, wherein the aperture stop of the imaging optical unit comprises an elliptical aperture stop.

19. The metrology system as claimed in claim 14, wherein the aperture stop of the imaging optical unit is arranged on a mirror of the imaging optical unit.

20. The metrology system as claimed in claim 14, wherein the imaging optical unit has a wavefront error (rms) that is less than 100 mλ.

21. The metrology system of claim 14 in which the aperture stop of the imaging optical unit comprises at least one of an oval aperture stop or a rectangular aperture stop.

* * * * *

UNITED STATES PATENT AND TRADEMARK OFFICE
CERTIFICATE OF CORRECTION

PATENT NO. : 10,606,048 B2
APPLICATION NO. : 15/410904
DATED : March 31, 2020
INVENTOR(S) : Johannes Ruoff et al.

Page 1 of 1

It is certified that error appears in the above-identified patent and that said Letters Patent is hereby corrected as shown below:

In the Specification

Column 2
Line 55, after "400" insert -- µm. --

Column 3
Line 29, delete "(rms )" and insert -- (rms) --

Column 16
Line 30, delete "they direction" and insert -- the y direction --

Signed and Sealed this
Fourteenth Day of July, 2020

Andrei Iancu
*Director of the United States Patent and Trademark Office*